United States Patent
Jung et al.

(10) Patent No.: US 11,900,869 B2
(45) Date of Patent: Feb. 13, 2024

(54) DISPLAY DEVICE

(71) Applicant: Samsung Display Co., Ltd., Yongin-si (KR)

(72) Inventors: Soo-Young Jung, Hwaseong-si (KR); Sungjun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/084,416

(22) Filed: Dec. 19, 2022

(65) Prior Publication Data
US 2023/0215349 A1 Jul. 6, 2023

(30) Foreign Application Priority Data

Dec. 31, 2021 (KR) .................. 10-2021-0193869

(51) Int. Cl.
*G06F 1/16* (2006.01)
*G09G 3/3208* (2016.01)

(52) U.S. Cl.
CPC ......... *G09G 3/3208* (2013.01); *G06F 1/1601* (2013.01)

(58) Field of Classification Search
CPC ..... H01L 21/311; H01L 23/50; H01L 23/528; H01L 25/16; H01L 27/12; H01L 27/32; H01L 29/08; H01L 29/66; H01L 29/786; H01L 51/00; H01L 51/50; H01L 51/52; H01L 51/56; G09G 3/3208; G09G 3/3225; G09G 3/3291; G06F 1/16; H04N 5/225
See application file for complete search history.

(56) References Cited

U.S. PATENT DOCUMENTS 7,986,095 B2 7/2011 Rhee et al.
8,981,362 B2 3/2015 Choi et al.
(Continued)

FOREIGN PATENT DOCUMENTS

CN 108832022 A 11/2018
JP 6230627 B2 11/2017
(Continued)

OTHER PUBLICATIONS

Jae Bong Lee et al., "Spreading and Deposition Characteristics of a Water Droplet Impacting on Hydrophobic Textured Surfaces", Journal of Ilass-Korea, vol. 17 No. 1 (2012).

*Primary Examiner* — Chanh D Nguyen
*Assistant Examiner* — Nguyen H Truong
(74) *Attorney, Agent, or Firm* — Lewis Roca Rothgerber Christie LLP

(57) ABSTRACT

A display device includes: a base layer comprising a display area and a non-display area surrounding at least a portion of the display area; an insulating layer on the base layer and having an engraved pattern formed by removing at least a portion thereof in a thickness direction to overlap the non-display area; a light emitting element overlapping the display area and on the base layer; and an organic layer overlapping the display area and the non-display area, covering at least a portion of the engraved pattern, and on the light emitting element, wherein the engraved pattern comprises an extension portion extending in an extension direction along one side of the display area and protruding portions protruding from the extension portion to a cross direction away from the display area and spaced apart from each other.

30 Claims, 25 Drawing Sheets

(56) References Cited

U.S. PATENT DOCUMENTS

| | | | |
|---|---|---|---|
| 9,076,739 B2 | 7/2015 | Choi et al. | |
| 9,391,296 B2 | 7/2016 | Park et al. | |
| 9,847,508 B2 | 12/2017 | Furuie | |
| 2015/0228927 A1* | 8/2015 | Kim | H10K 59/131 |
| | | | 257/40 |
| 2017/0012233 A1 | 1/2017 | Masuda et al. | |
| 2018/0159077 A1* | 6/2018 | Lee | H10K 50/844 |
| 2018/0166019 A1* | 6/2018 | Lee | G02F 1/136227 |
| 2020/0235338 A1* | 7/2020 | Kim | H10K 59/122 |
| 2020/0328376 A1 | 10/2020 | Seo et al. | |
| 2020/0350301 A1* | 11/2020 | Zhai | H10K 59/126 |

FOREIGN PATENT DOCUMENTS

| | | |
|---|---|---|
| KR | 10-1152134 B1 | 6/2012 |
| KR | 10-2015-0025994 A | 3/2015 |
| KR | 10-2017-0098148 A | 8/2017 |
| KR | 10-2036328 B1 | 10/2019 |
| KR | 10-2064392 B1 | 1/2020 |
| KR | 10-2020-0120804 A | 10/2020 |

* cited by examiner

DISPLAY DEVICE

CROSS-REFERENCE TO RELATED APPLICATION

The present application claims priority to and the benefit of Korean Patent Application No. 10-2021-0193869, filed on Dec. 31, 2021, in the Korean Intellectual Property Office, the contents of which are hereby incorporated by reference in its entirety.

BACKGROUND

1. Field

Aspects of some embodiments of the present disclosure relate to a display device.

2. Description of the Related Art

Various display devices that are applied to multimedia devices, such as televisions, mobile phones, tablet computers, navigation devices, and game devices, are being developed. A display device includes pixels configured to display images and includes a thin film encapsulation layer covering the pixels.

The encapsulation layer may include an organic layer formed by curing a liquid organic material.

The above information disclosed in this Background section is only for enhancement of understanding of the background and therefore the information discussed in this Background section does not necessarily constitute prior art.

SUMMARY

Aspects of some embodiments of the present disclosure relate to a display device. For example, the present disclosure relates to a display device with relatively improved visibility.

Aspects of some embodiments may relate to a structure that controls a flow of the organic material to form the organic material having fluidity at a desired area in the display device.

Aspects of some embodiments of the present disclosure include a display device capable of preventing or reducing defects in visibility from occurring in an end portion of a display area thereof by controlling a flow of an organic material.

According to some embodiments of the inventive concept, a display device includes a base layer including a display area and a non-display area surrounding at least a portion of the display area, an insulating layer on the base layer and provided with an engraved pattern formed by removing at least a portion thereof in a thickness direction to overlap the non-display area, a light emitting element overlapping the display area and on the base layer, and an organic layer overlapping the display area and the non-display area, covering at least a portion of the engraved pattern, and on the light emitting element. According to some embodiments, the engraved pattern includes an extension portion extending in an extension direction along one side of the display area and protruding portions protruded from the extension portion to a cross direction away from the display area and spaced apart from each other.

According to some embodiments, the extension portion includes pattern portions and connection portions alternately arranged with the pattern portions in the extension direction, each of the pattern portions extends from a protruding portion adjacent thereto among the protruding portions, and a combined shape of a pattern portion and a protruding portion, which correspond to each other, has a polygonal shape or a circular shape.

According to some embodiments, each of the connection portions has an area equal to or smaller than about 30% of an area of the combined shape of the pattern portion and the protruding portion, which correspond to each other.

According to some embodiments, a maximum width in the extension direction of each of the protruding portions is equal to or smaller than about 100 micrometers.

According to some embodiments, the engraved pattern is provided in plural, and the engraved patterns are arranged spaced apart from each other in the cross direction.

According to some embodiments, the engraves patterns include a first engraved pattern and a second engraved pattern, and the protruding portions of the second engraved pattern are aligned with the protruding portions of the first engraved pattern in the cross direction.

According to some embodiments, the engraves patterns include a first engraved pattern and a second engraved pattern, the second engraved pattern is shifted from the first engraved pattern to the extension direction, and each of the protruding portions of the second engraved pattern is to overlap an area between protruding portions adjacent to each other of the first engraved pattern in the cross direction.

According to some embodiments, the insulating layer is between the base layer and the light emitting element.

According to some embodiments, the display device further includes a transistor between the base layer and the light emitting element. The insulating layer includes a first display insulating layer on the transistor and a second display insulating layer on the first display insulating layer, and the second display insulating layer includes an insulating pattern overlapping the display area and a portion of the non-display area and a dam pattern overlapping the non-display area and spaced apart from the insulating pattern.

According to some embodiments, the engraved pattern is spaced apart from the dam pattern and defined in the first display insulating layer.

According to some embodiments, the first display insulating layer further includes a valley pattern extending in the extension direction and formed by removing at least a portion of the first display insulating layer, which overlaps the non-display area, in the thickness direction.

According to some embodiments, the engraved pattern is spaced apart from the valley pattern.

According to some embodiments, the engraved pattern is further spaced apart from the one side of the display area than the dam pattern and the valley pattern are.

According to some embodiments, the engraved pattern is between the dam pattern and the valley pattern.

According to some embodiments, the engraved pattern is closer to the one side of the display area than the dam pattern and the valley pattern are.

According to some embodiments, the engraved pattern is defined in the valley pattern.

According to some embodiments, the engraved pattern is defined in the dam pattern.

According to some embodiments, the display device further includes a pixel definition layer. According to some embodiments, the light emitting element includes a lower electrode on the insulating layer and an upper electrode on the lower electrode, the pixel definition layer is provided with a light emitting opening defined therethrough to expose at least a portion of the lower electrode, and the insulating layer further includes an additional dam pattern on the dam pattern and including a same material as the pixel definition layer.

According to some embodiments, the engraved pattern is spaced apart from the dam pattern and the additional dam pattern and defined in the first display insulating layer.

According to some embodiments, the engraved pattern is defined in the additional dam pattern.

According to some embodiments, the insulating layer includes a valley pattern extending in the extension direction of the display area and formed by removing at least a portion of the insulating layer, which overlaps the non-display area, in the thickness direction.

According to some embodiments, the display device further includes a first inorganic layer between the light emitting element and the organic layer and a second inorganic layer on the organic layer, and the first inorganic layer and the second inorganic layer are in contact with each other in the non-display area.

According to some embodiments, the display device further includes a pixel definition layer, at least one sensing insulating layer, and a sensing pattern layer. According to some embodiments, the light emitting element includes a lower electrode and an upper electrode on the lower electrode, the pixel definition layer is provided with a light emitting opening defined therethrough to expose at least a portion of the lower electrode, the sensing insulating layer is between the upper electrode and the organic layer, the sensing pattern layer is on the sensing insulating layer and provided with a pattern opening defined therethrough to overlap the light emitting opening, the organic layer is on the sensing insulating layer and covers the sensing pattern layer, and the organic layer has a refractive index different from a refractive index of the sensing pattern layer.

According to some embodiments, the base layer includes a first non-bending area, a bending area, and a second non-bending area, which are sequentially arranged in the cross direction, the bending area is bent with respect to an imaginary axis extending in the extension direction, the display area includes a portion of the first non-bending area, the non-display area includes the other portion of the first non-bending area, the bending area, and the second non-bending area, and the engraved pattern is between the one side of the display area and the bending area.

According to some embodiments of the inventive concept, a display device includes a base layer including a display area and a non-display area surrounding at least a portion of the display area, a circuit element layer including at least one transistor and at least one display insulating layer and on the base layer, a display element layer on the circuit element layer and including a lower electrode and a pixel definition layer provided with a light emitting opening defined therethrough to expose at least a portion of the lower electrode, and an organic layer on the display element layer and overlapping the display area and the non-display area. According to some embodiments, at least one of the display insulating layer or the pixel definition layer includes an engraved pattern defined therein and including an extension portion extending in an extension direction along one side of the display area and protruding portions protruded from the extension portion to a cross direction away from the display area and spaced apart from each other, and the organic layer covers at least a portion of the engraved pattern.

According to some embodiments, the extension portion includes pattern portions and connection portions alternately arranged with the pattern portions in the extension direction, each of the pattern portions extends from a protruding portion adjacent thereto among the protruding portions, a combined shape of a pattern portion and a protruding portion, which correspond to each other, has a polygonal shape or a circular shape, and each of the connection portions has an area equal to or smaller than about 30% of an area of the combined shape of the pattern portion and the protruding portion, which correspond to each other.

According to some embodiments, a maximum width in the extension direction of each of the protruding portions is equal to or smaller than about 100 micrometers.

According to some embodiments, the display device further includes a first inorganic layer between the display element layer and the organic layer and a second inorganic layer on the organic layer, and the first inorganic layer and the second inorganic layer are in contact with each other in the non-display area.

According to some embodiments, the display device further includes at least one sensing insulating layer on the second inorganic layer and a sensing pattern layer on the sensing insulating layer and provided with a pattern opening defined therethrough to overlap the light emitting opening. According to some embodiments, the organic layer further includes an additional organic layer on the sensing insulating layer and covering the sensing pattern layer, and the additional organic layer has a refractive index different from a refractive index of the sensing pattern layer.

According to some embodiments, the engraved pattern includes a first engraved pattern group in which at least a portion thereof is covered by the organic layer and a second engraved pattern group in which at least a portion thereof is covered by the additional organic layer.

According to some embodiments, as a flow of an organic material is controlled and a degree of spread of the organic material in the non-display area is reduced, a contact angle of the organic layer formed at an end portion thereof increases. Accordingly, instances of the organic layer sagging at an end of the display area may be prevented or reduced, and a variation in thickness of the organic layer may be reduced. Thus, defects in visibility may be reduced, and a reliability of the display device may be relatively improved.

BRIEF DESCRIPTION OF THE DRAWINGS

The above and other characteristics of embodiments according to the present disclosure will become more readily apparent by reference to the following detailed description when considered in conjunction with the accompanying drawings wherein.

DETAILED DESCRIPTION

Figure 1A:
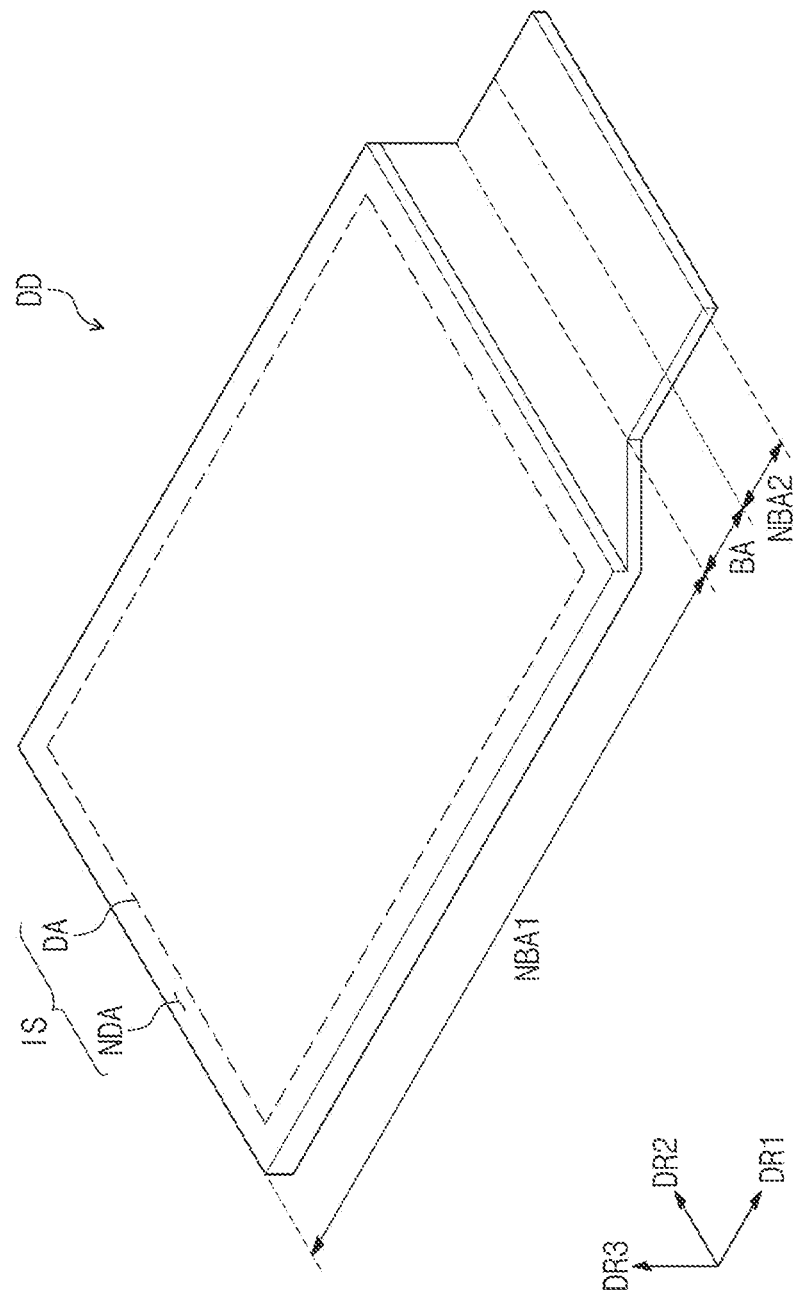
FIGS. 1A and 1B are perspective views of a display device according to some embodiments of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, aspects of some embodiments of the present disclosure will be described with reference to accompanying drawings.

Figure 1B:
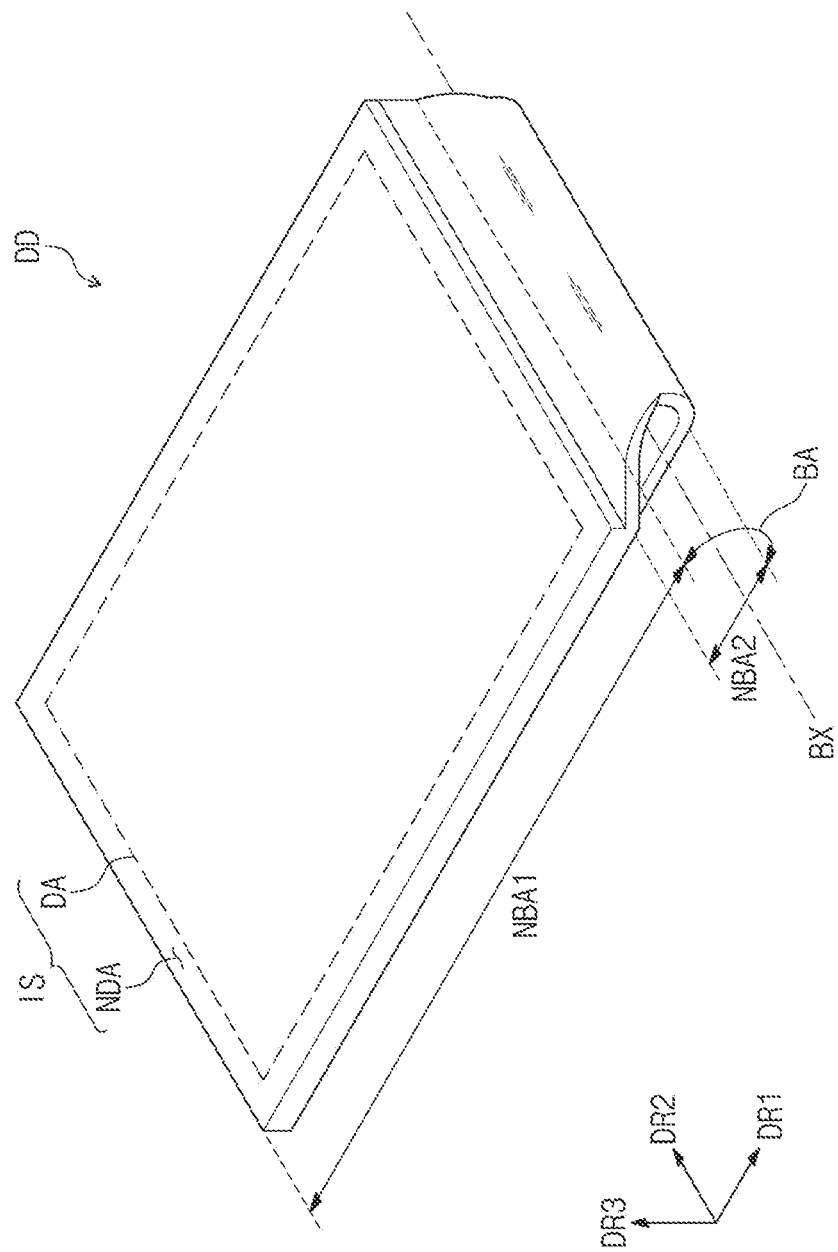
Figure 2:
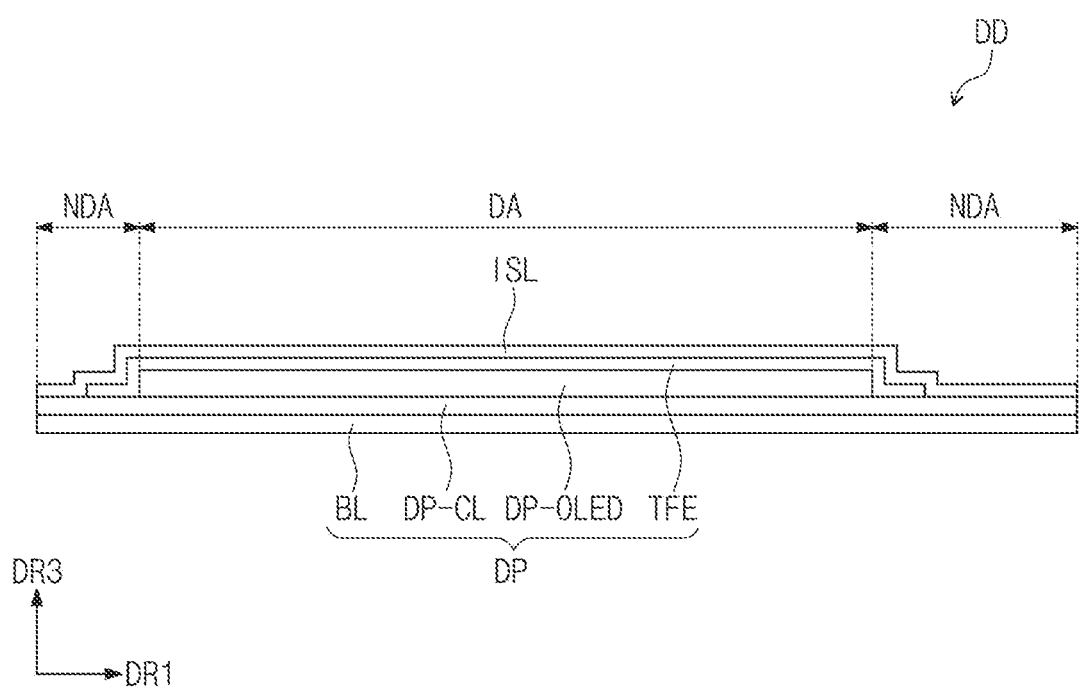
FIG. 2 is a cross-sectional view of a display device according to some embodiments of the present disclosure.

FIGS. 1A and 1B are perspective views of a display device DD according to some embodiments of the present disclosure. FIG. 2 is a cross-sectional view of the display device DD according to some embodiments of the present disclosure.

Referring to FIGS. 1A and 1B, a display surface IS may be substantially parallel to a plane defined by a first directional axis DR1 and a second directional axis DR2. A normal line direction of the display surface IS, i.e., a thickness direction of the display device DD (e.g., a direction normal or perpendicular with respect to a plane of the display surface IS), may be indicated by a third directional axis DR3. According to some embodiments, front (or upper) and rear (or lower) surfaces of each member may be distinguished from each other with respect to the third directional axis DR3. However, directions indicated by the first, second, and third directional axes DR1, DR2, and DR3 are relative to each other and may be changed in other directions. Hereinafter, first, second, and third directions are directions indicated by first, second, and third directional axes DR1, DR2, and DR3, respectively, and are assigned with the same reference numerals as those of the first, second, and third directional axes DR1, DR2, and DR3.

The display device DD may be applied to a large-sized electronic item, such as a television set and a monitor, and a small and medium-sized electronic item, such as a mobile phone, a tablet computer, a car navigation unit, a game unit, and a smart watch.

As shown in FIGS. 1A and 1B, the display device DD may include a display area DA at which images are displayed and a non-display area NDA defined adjacent to the display area DA where images are not displayed. The images may not be displayed through the non-display area NDA. As an example, the display area DA may have a quadrangular shape. The non-display area NDA may surround at least a portion of the display area DA. In FIGS. 1A and 1B, a structure in which the non-display area NDA entirely surrounds the display area DA is shown as a representative example, however, they should not be limited thereto or thereby. According to some embodiments, the non-display area NDA may be located adjacent to only a portion of the display area DA. The shape of the display area DA and the shape of the non-display area NDA may be changed.

According to some embodiments, a portion of the display device DD may be bent. The display device DD may include a first non-bending area NBA1, a second non-bending area NBA2 spaced apart from the first non-bending area NBA1 in the first directional axis DR1, and a bending area BA defined between the first non-bending area NBA1 and the second non-bending area NBA2.

The bending area BA may be bent with respect to a bending axis BX defined in the second directional axis DR2. When the bending area BA is bent, the second non-bending area NBA2 may face the first non-bending area NBA1 as shown in FIG. 1B. The bending area BA and the second non-bending area NBA2 may have a width smaller than that of the first non-bending area NBA1 in the second directional axis DR2.

The display area DA, the non-display area NDA, the first non-bending area NBA1, the second non-bending area NBA2, and the bending area BA may be applied to a display panel DP (refer to FIG. 2) and an input sensor ISL (refer to FIG. 2) of the display device DD.

FIG. 2 is a cross-sectional view of the display device DD according to some embodiments of the present disclosure. FIG. 2 shows a cross-section of the display device DD defined by the first direction DR1 and the third direction DR3.

Referring to FIG. 2, the display device DD may include the display panel DP and the input sensor ISL. According to some embodiments, the display device DD may include a protective member located on a lower surface of the display panel DP or an anti-reflective member and/or a window member located on an upper surface of the input sensor ISL.

The display panel DP may be a light emitting type display panel, however, embodiments according to the present disclosure are not limited thereto. For instance, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot, a quantum rod or a micro-LED. Hereinafter, the organic light emitting display panel will be described as a representative example of the display panel DP.

The display panel DP may include a base layer BL, a circuit element layer DP-CL, a display element layer DP-OLED, and a thin film encapsulation layer TFE. The circuit element layer DP-CL, the display element layer DP-OLED, and the thin film encapsulation layer TFE may be located on the base layer BL. The input sensor ISL may be located directly on the thin film encapsulation layer TFE. In the present disclosure, the expression "a component A is located directly on a component B" means that no adhesive layers are present between the component B and the component A.

The base layer BL may include at least one plastic film. The base layer BL may include a plastic substrate, a glass substrate, a metal substrate, or an organic/inorganic composite material substrate as a flexible substrate. The display area DA, the non-display area NDA, the first non-bending area NBA1, the second non-bending area NBA2, and the bending area BA described with reference to FIGS. 1A and 1B may be applied to the base layer BL.

The circuit element layer DP-CL may include at least one insulating layer and a circuit element. The insulating layer may include at least one inorganic layer and at least one organic layer. The circuit element may include signal lines and a pixel driving circuit. This will be described in more detail later.

The display element layer DP-OLED may include a display element. The display element layer DP-OLED may further include an organic layer such as a pixel definition layer.

The thin film encapsulation layer TFE may include a plurality of thin layers. Some thin layers may be located to improve an optical efficiency, and some thin layers may be located to protect organic light emitting diodes. The thin film encapsulation layer TFE will be described in more detail later.

The input sensor ISL may obtain coordinate information of an external input. The input sensor ISL may have a multi-layer structure. The input sensor ISL may include a conductive layer having a single-layer or multi-layer structure. The input sensor ISL may include an insulating layer having a single-layer or multi-layer structure. The input sensor ISL may sense the external input by a capacitive method. The operation method of the input sensor ISL should not be particularly limited. The input sensor ISL may sense the external input by an electromagnetic induction method or a pressure sensing method.

Figure 3:
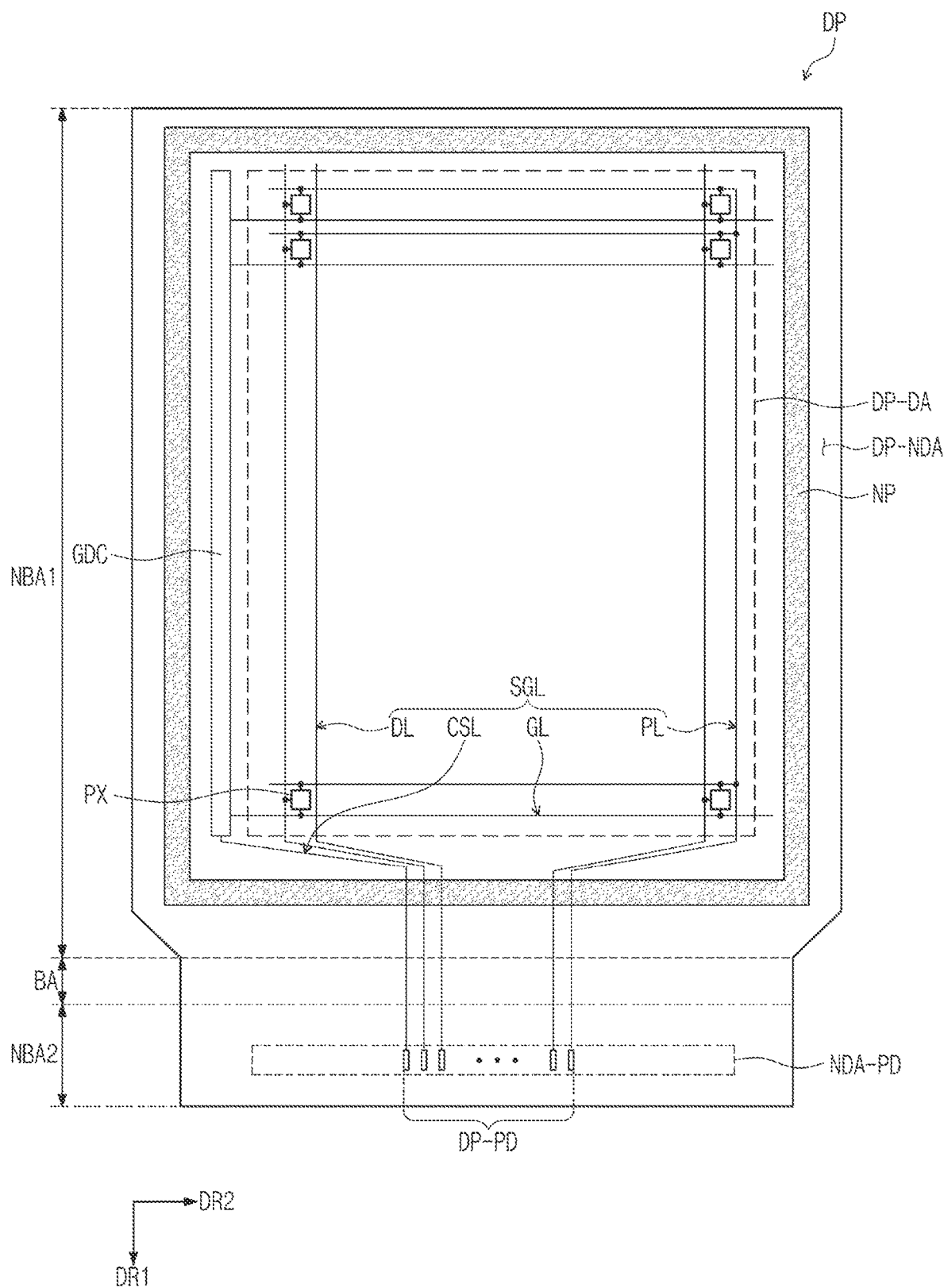
FIG. 3 is a plan view of a display panel according to some embodiments of the present disclosure.
Figure 4:
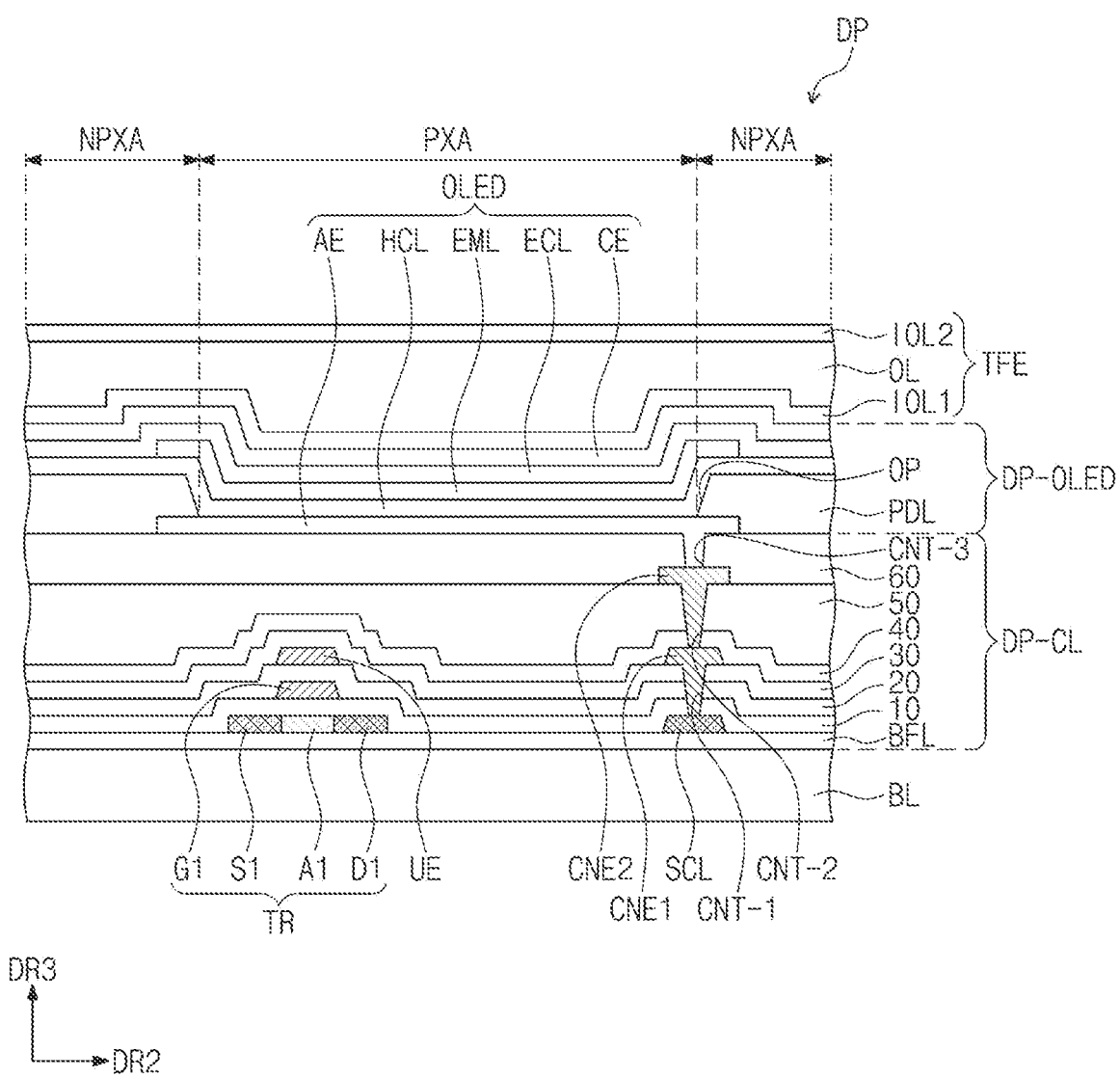
FIG. 4 is a cross-sectional view of a display panel according to some embodiments of the present disclosure.
Figure 5:
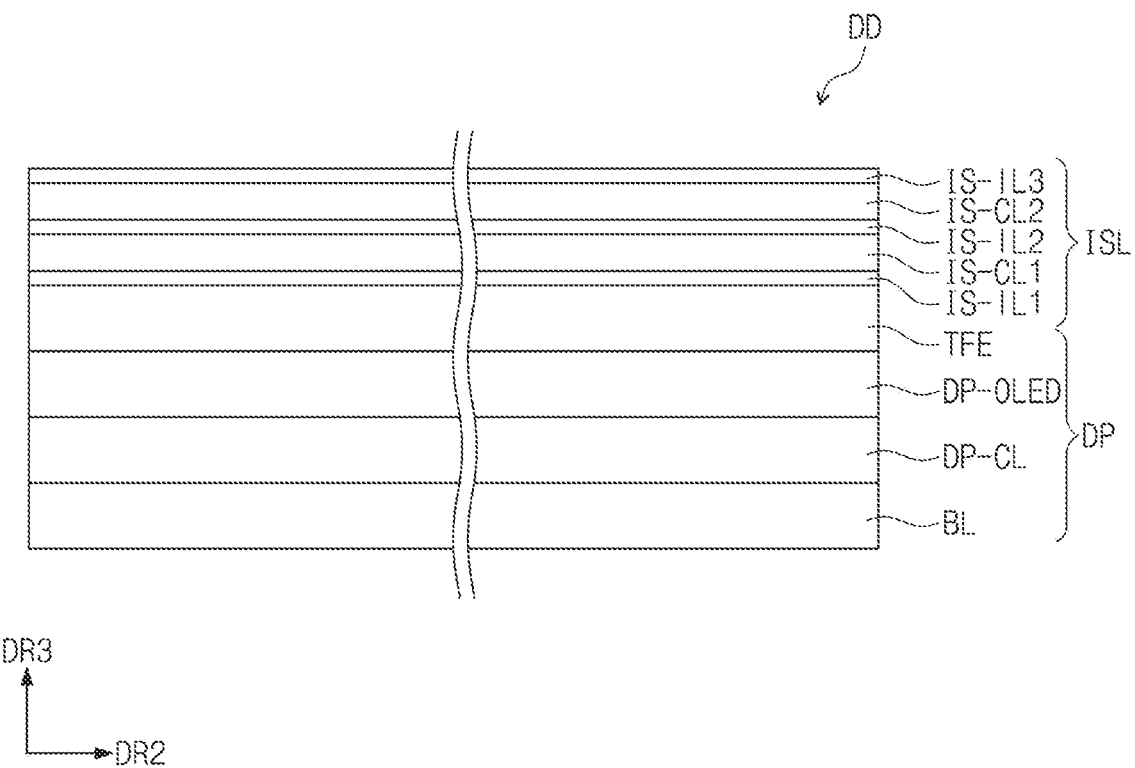
FIG. 5 is a cross-sectional view of a display device according to some embodiments of the present disclosure.

FIG. 3 is a plan view of the display panel DP according to some embodiments of the present disclosure. FIG. 4 is a cross-sectional view of the display panel DP according to some embodiments of the present disclosure. FIG. 5 is a cross-sectional view of the display device DD according to some embodiments of the present disclosure.

Referring to FIG. 3, the display panel DP may include a display area DP-DA and a non-display area DP-NDA adjacent to the display area DP-DA when viewed in a plane. According to some embodiments, the non-display area DP-NDA may be defined along an edge of the display area DP-DA. The display area DP-DA and the non-display area DP-NDA of the display panel DP may respectively correspond to the display area DA and the non-display area NDA of the display device DD shown in FIGS. 1A and 1B.

The display panel DP may include a first non-bending area NBA1, a second non-bending area NBA2, and a bending area BA. The first non-bending area NBA1, the second non-bending area NBA2, and the bending area BA of the display panel DP may respectively correspond to the first non-bending area NBA1, the second non-bending area NBA2, and the bending area BA of the display device DD shown in FIGS. 1A and 1B.

However, the areas of the display panel DP are not required to be the same as the areas of the display device DD corresponding thereto and may be changed according to a structure/design of the display panel DP.

The display panel DP may include a plurality of pixels PX, a driving circuit GDC, and a plurality of signal lines SGL. The pixels PX may be arranged in the display area DP-DA. Each of the pixels PX may include an organic light emitting diode and a pixel driving circuit connected to the organic light emitting diode.

The driving circuit GDC, the signal lines SGL, and the pixel driving circuit may be included in the circuit element layer DP-CL shown in FIG. 2.

The driving circuit GDC may include a scan driving circuit. The scan driving circuit may generate a plurality of scan signals and may sequentially output the scan signals to a plurality of scan lines GL described later. The scan driving circuit may further output another control signal to the driving circuit of the pixels PX.

The scan driving circuit may include a plurality of thin film transistors formed through the same processes, e.g., a low temperature polycrystalline silicon (LTPS) process or a low temperature polycrystalline oxide (LTPO) process, as the driving circuit of the pixels PX.

The signal lines SGL may include the scan lines GL, data lines DL, a power line PL, and a control signal line CSL. Each of the scan lines GL may be connected to a corresponding pixel among the pixels PX, and each of the data lines DL may be connected to a corresponding pixel among the pixels PX. The power line PL may be connected to the pixels PX. The control signal line CSL may provide control signals to the scan driving circuit.

The display panel DP may include signal pads DP-PD connected to one ends of the signal lines SGL. An area where the signal pads DP-PD are located in the non-display area DP-NDA may be defined as a pad area NDA-PD.

The display panel DP may include an engraved pattern NP. The engraved pattern NP may be defined in the non-display area DP-NDA.

The engraved pattern NP may surround at least a portion of the display area DP-DA. FIG. 3 shows a structure in which the engraved pattern NP surrounds four sides of the display area DP-DA as a representative example, however, the present disclosure should not be limited thereto or thereby. According to some embodiments, the engraved pattern NP may be located adjacent to only a portion of the display area DP-DA. As an example, the engraved pattern NP may extend along only one side of the display area DP-DA, which is closest to the bending area BA.

According to some embodiments, the engraved pattern NP may prevent or reduce an overflow of a liquid organic material in an inkjet process of the display panel DP. The engraved pattern NP will be described in more detail later.

FIG. 4 shows a cross-section of the display panel DP in the display area DP-DA (refer to FIG. 3). The circuit element layer DP-CL, the display element layer DP-OLED, and the thin film encapsulation layer TFE may be sequentially stacked on the base layer BL.

The circuit element layer DP-CL may include at least one insulating layer and a circuit element. The circuit element may include the signal line and the pixel driving circuit. The circuit element layer DP-CL may be formed by a coating or depositing process to form an insulating layer, a semiconductor layer, and a conductive layer and a photolithography process to pattern the insulating layer, the semiconductor layer, and the conductive layer.

The display element layer DP-OLED may include at least one transistor TR and a plurality of display insulating layers BFL and 10 to 60. According to some embodiments, the display insulating layers BFL and 10 to 60 may include a buffer layer BFL, a first insulating layer 10, a second insulating layer 20, a third insulating layer 30, a fourth insulating layer 40, a fifth insulating layer 50, and a sixth insulating layer 60.

The buffer layer BFL may include a plurality of inorganic layers stacked one on another. A semiconductor pattern may be located on the buffer layer BFL. The buffer layer BFL may increase an adhesion between the base layer BL and the semiconductor pattern.

The semiconductor pattern may include polysilicon, however, embodiments according to the present disclosure are not limited thereto or thereby. The semiconductor pattern may include an amorphous silicon or metal oxide. FIG. 4 shows a portion of the semiconductor pattern, and the semiconductor pattern may be further located in another area of the pixel PX in a plane. The semiconductor pattern may be arranged with a specific rule or pattern over the pixels PX (refer to FIG. 3).

The semiconductor pattern may have different electrical properties depending on whether it is doped or not or whether it is doped with an N-type dopant or a P-type dopant. The semiconductor pattern may include a first region A1 with low doping concentration and low conductivity and second regions S1 and D1 with relatively high doping concentration and high conductivity. One second region S1 may be located at one side of the first region A1, and the other second region D1 may be located at the other side of the first region A1. The second regions S1 and D1 may be doped with the N-type dopant or the P-type dopant. A P-type transistor may include a doped region doped with the P-type dopant. The first region A1 may be a non-doped region or may be doped at a concentration lower than the second regions S1 and D1.

The second regions S1 and D1 may substantially serve as an electrode or a signal line. The one second region S1 may correspond to a source of a transistor, and the other second region D1 may correspond to a drain of the transistor. FIG. 4 shows a portion of a connection signal line SCL formed of the semiconductor pattern. According to some embodiments, the connection signal line SCL may be connected to the drain of the transistor TR when viewed in a plane.

The first insulating layer 10 may be located on the buffer layer BFL. The first insulating layer 10 may commonly overlap the pixels PX (refer to FIG. 3) and may cover the semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon oxynitride, zirconium oxide, or hafnium oxide. Not only the first insulating layer 10 but also an insulating layer of the circuit element layer DP-CL described in more detail later may be an inorganic layer and/or an organic layer and may have a single-layer or multi-layer structure.

A gate G1 may be located on the first insulating layer 10. The gate G1 may include a plurality of metal layers. The gate G1 may overlap the first region A1. The gate G1 may be used as a mask in a process of doping the semiconductor pattern.

The second insulating layer 20 may be located on the first insulating layer 10 and may cover the gate G1. The second insulating layer 20 may commonly overlap the pixels PX (refer to FIG. 3). An upper electrode UE may be located on the second insulating layer 20. The upper electrode UE may overlap the gate G1. The upper electrode UE may include a plurality of metal layers. According to some embodiments, the upper electrode UE may be omitted.

The third insulating layer 30 may be located on the second insulating layer 20 and may cover the upper electrode UE. A first connection electrode CNE1 may be located on the third insulating layer 30. The first connection electrode CNE1 may be connected to the connection signal line SCL via a contact hole CNT-1 defined through the first, second, and third insulating layers 10, 20, and 30.

The fourth insulating layer 40 may be located on the third insulating layer 30. The fifth insulating layer 50 may be located on the fourth insulating layer 40. The fifth insulating layer 50 may be an organic layer. A second connection electrode CNE2 may be located on the fifth insulating layer 50. The second connection electrode CNE2 may be connected to the first connection electrode CNE1 via a contact hole CNT-2 defined through the fourth and fifth insulating layers 40 and 50.

The sixth insulating layer 60 (or a second display insulating layer) may be located on the fifth insulating layer 50.

The sixth insulating layer 60 may be directly in contact with the second connection electrode CNE2 and may cover the second connection electrode CNE2. The sixth insulating layer 60 may be an organic layer. A light emitting element OLED may be located on the sixth insulating layer 60.

A lower electrode AE (or an anode) may be located on the sixth insulating layer 60. The lower electrode AE may be connected to the second connection electrode CNE2 via a contact hole CNT-3 defined through the sixth insulating layer 60. A pixel definition layer PDL may be provided with a light emitting opening OP defined therethrough. At least a portion of the lower electrode AE may be exposed through the light emitting opening OP of the pixel definition layer PDL. The pixel definition layer PDL may be an organic layer.

As shown in FIG. 4, the display area DP-DA may include a light emitting area PXA and a non-light-emitting area NPXA adjacent to the light emitting area PXA. The non-light-emitting area NPXA may surround the light emitting area PXA. According to some embodiments, the light emitting area PXA may be defined to correspond to the portion of the lower electrode AE, which is exposed through the light emitting opening OP.

A hole control layer HCL may be commonly located in the light emitting area PXA and the non-light-emitting area NPXA. The hole control layer HCL may include a hole transport layer and may further include a hole injection layer. A light emitting layer EML may be located on the hole control layer HCL. The light emitting layer EML may be located in an area corresponding to the light emitting opening OP. That is, the light emitting layer EML may be arranged separately in each of the pixels PX (refer to FIG. 3) after being divided into portions.

An electron control layer ECL may be located on the light emitting layer EML. The electron control layer ECL may include an electron transport layer and may further include an electron injection layer. The hole control layer HCL and the electron control layer ECL may be commonly located over the pixels PX (refer to FIG. 3) using an open mask. An upper electrode CE (or a cathode) may be located on the electron control layer ECL. The upper electrode CE may have an integral shape and may be commonly located over the pixels PX (refer to FIG. 3). As shown in FIG. 4, the thin film encapsulation layer TFE may be located on the upper electrode CE.

The thin film encapsulation layer TFE may include a plurality of thin films. The thin film encapsulation layer TFE may include a first inorganic layer IOL1, an organic layer OL, and a second inorganic layer IOL2. The first inorganic layer IOL1 may be located on the upper electrode CE. The organic layer OL may be located on the first inorganic layer IOL1. The second inorganic layer IOL2 may be located on the organic layer OL.

The first inorganic layer IOL1 and the second inorganic layer IOL2 may protect the display element layer DP-OLED from moisture and oxygen, and the organic layer OL may protect the display element layer DP-OLED from a foreign substance such as dust particles.

However, the configuration and the stack structure of the thin film encapsulation layer TFE is not limited thereto or thereby. As an example, the thin film encapsulation layer TFE may further include a capping layer located between the upper electrode CE and the first inorganic layer IOL1. The capping layer may include an organic material.

According to some embodiments of the present disclosure, the organic layer OL may be formed by the inkjet process. The organic layer OL will be described in more detail later.

FIG. 5 schematically shows the cross-section of the display panel DP and the input sensor ISL. The stack structure of the display panel DP is described in more detail with reference to FIG. 4, so that hereinafter the input sensor ISL will be described in more detail with reference to FIG. 5.

Referring to FIG. 5, the input sensor ISL may include a first sensing insulating layer IS-IL1, a first conductive pattern layer IS-CL1, a second sensing insulating layer IS-IL2, a second conductive pattern layer IS-CL2, and a third sensing insulating layer IS-IL3.

The first sensing insulating layer IS-IL1 may be located directly on the thin film encapsulation layer TFE. According to some embodiments, the first sensing insulating layer IS-IL1 and/or the third sensing insulating layer IS-IL3 may be omitted. When the first sensing insulating layer IS-IL1 is omitted, the thin film encapsulation layer TFE may correspond to a base insulating layer. The third sensing insulating layer IS-IL3 may be replaced with an adhesive used to attach an upper member located on the input sensor ISL.

Each of the first conductive pattern layer IS-CL1 and the second conductive pattern layer IS-CL2 may have a plurality of conductive patterns. The conductive patterns may have a single-layer structure or a multi-layer structure of layers stacked in the third directional axis DR3. The conductive pattern having the multi-layer structure may include two or more layers of transparent conductive layers and metal layers. The conductive pattern having the multi-layer structure may include metal layers containing different metals from each other. The transparent conductive layer may include indium tin oxide (ITO), indium zinc oxide (IZO), zinc oxide (ZnO), indium tin zinc oxide (ITZO), PEDOT, metal nanowire, or graphene. The metal layer may include molybdenum, silver, titanium, copper, aluminum, or alloys thereof.

The conductive patterns may include sensing electrodes and signal lines connected to the conductive patterns. This will be described in more detail later.

Each of the first, second, and third sensing insulating layers IS-IL1, IS-IL2, and IS-IL3 may include an inorganic layer or an organic layer. According to some embodiments, each of the first and second sensing insulating layers IS-IL1 and IS-IL2 may be the inorganic layer. The inorganic layer may include at least one of aluminum oxide, titanium oxide, silicon oxide, silicon oxynitride, zirconium oxide, or hafnium oxide. The third sensing insulating layer IS-IL3 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyimide-based resin, or a perylene-based resin. However, materials for the first sensing insulating layer IS-IL1 to the third sensing insulating layer IS-IL3 should not be particularly limited.

Figure 6:
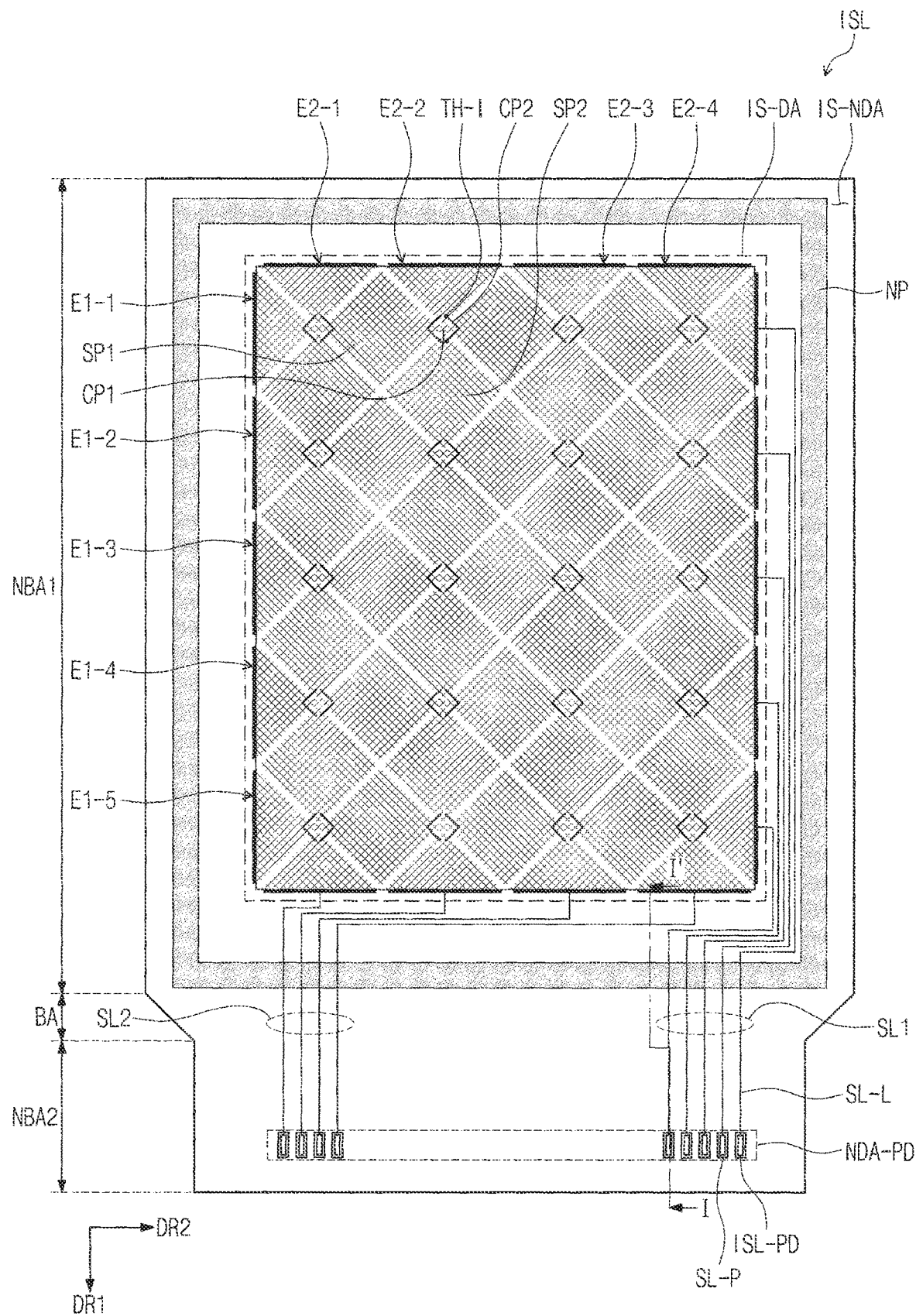
FIG. 6 is a plan view of an input sensor according to some embodiments of the present disclosure.

FIG. 6 is a plan view of the input sensor ISL according to some embodiments of the present disclosure.

Referring to FIG. 6, the input sensor ISL may include a sensing area IS-DA and a non-sensing area IS-NDA adjacent to the sensing area IS-DA. The sensing area IS-DA and the non-sensing area IS-NDA may respectively correspond to the display area DP-DA and the non-display area DP-NDA shown in FIG. 3.

Lower electrodes E1-1 to E1-5 and upper electrodes E2-1 to E2-4 insulating from the lower electrodes E1-1 to E1-5 while crossing the lower electrodes E1-1 to E1-5 may be arranged in the sensing area IS-DA. First signal lines SL1 electrically connected to the lower electrodes E1-1 to E1-5 and second signal lines SL2 electrically connected to the upper electrodes E2-1 to E2-4 may be arranged in the non-sensing area IS-NDA. One of the first signal lines SL1 and the second signal lines SL2 may apply a transmission signal from an external circuit to corresponding electrodes to sense the external input, and the other one of the first signal lines SL1 and the second signal lines SL2 may apply a variation in capacitance between the lower electrodes E1-1 to E1-5 and the upper electrodes E2-1 to E2-4 to the external circuit as a reception signal.

Each of the first signal lines SL1 and the second signal lines SL2 may include a line part SL-L and a pad part SL-P. Each of the first signal lines SL1 and the second signal lines SL2 may have an integral shape or may include a plurality of portions connected to each other via a contact hole defined through the insulating layer. Some of the portions may be located on different layers from each other. The line part SL-L and the pad part SL-P of the signal line having the integral shape may be located on the same layer. The line part SL-L and the pad part SL-P, which are located on the same layer, may be formed through the same process and may have the same stack structure.

Each of the lower electrodes E1-1 to E1-5 and the upper electrodes E2-1 to E2-4 may have a mesh shape in which a plurality of openings is defined. The openings may be defined to correspond to the light emitting area PXA (refer to FIG. 4) of the display panel DP (refer to FIG. 4).

The upper electrodes E2-1 to E2-4 may be insulated from the lower electrodes E1-1 to E1-5 while crossing the lower electrodes E1-1 to E1-5. One of the lower electrodes E1-1 to E1-5 and the upper electrodes E2-1 to E2-4 may have an integral shape. In FIG. 6, the lower electrodes E1-1 to E1-5 having the integral shape are shown as a representative example. The lower electrodes E1-1 to E1-5 may include sensing portions SP1 and intermediate portions CP1.

Each of the upper electrodes E2-1 to E2-4 may include sensing patterns SP2 and bridge patterns CP2 (or connection patterns). Two sensing patterns SP2 adjacent to each other may be connected to each other by two bridge patterns CP2, however, the number of the bridge patterns CP2 should not be limited to two.

The bridge patterns CP2 may be formed by patterning the first conductive pattern layer IS-CL1 shown in FIG. 5, and the lower electrodes E1-1 to E1-5 and the sensing patterns SP2 may be formed by patterning the second conductive pattern layer IS-CL2 shown in FIG. 5.

The engraved pattern NP provided in the display panel DP (refer to FIG. 3) is additionally illustrated in FIG. 6 to show relative positions between components of the input sensor ISL and the engraved pattern NP.

Figure 7A:
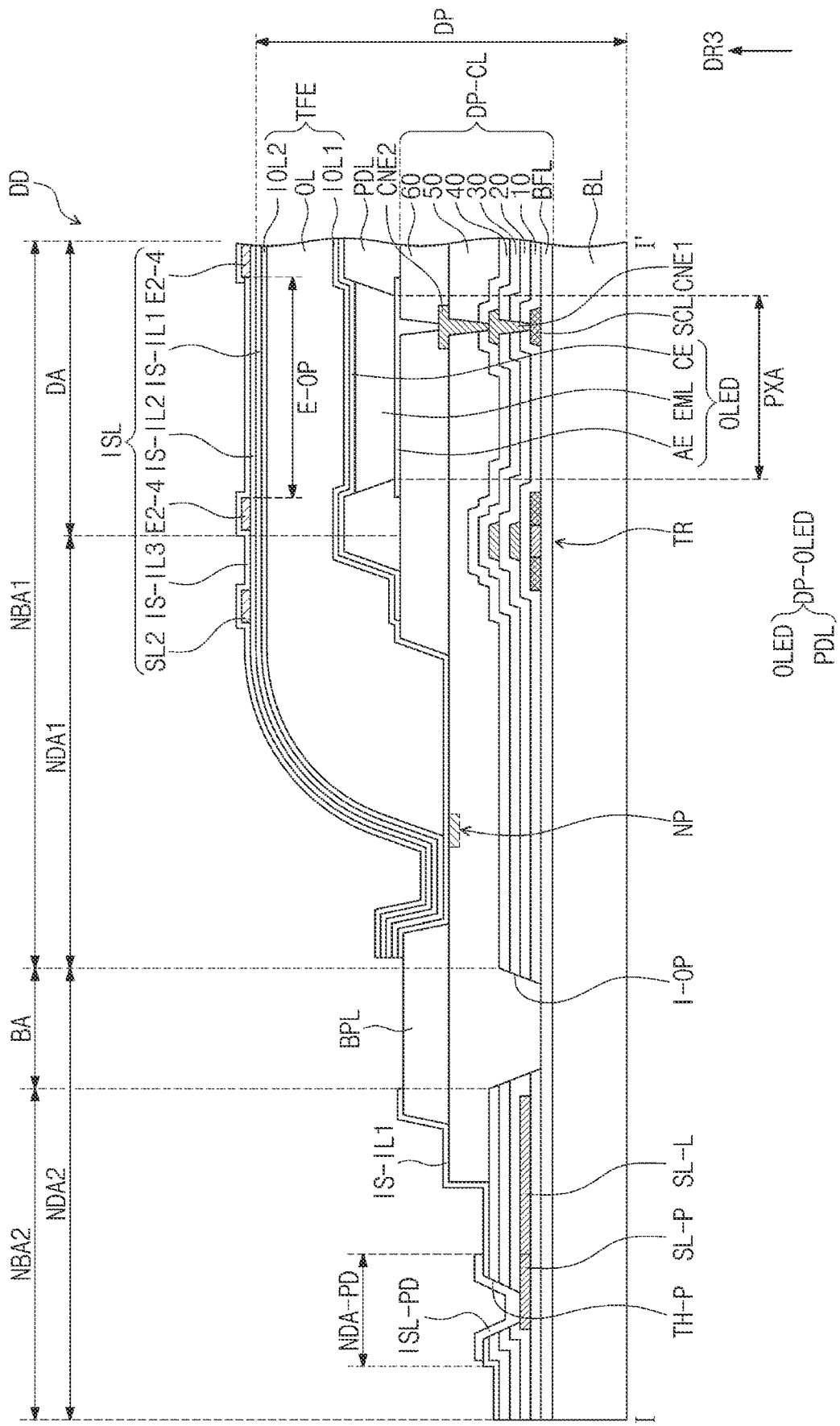
FIG. 7A is a cross-sectional view of a display device taken along a line I-I' of FIG. 6.
Figure 7B:
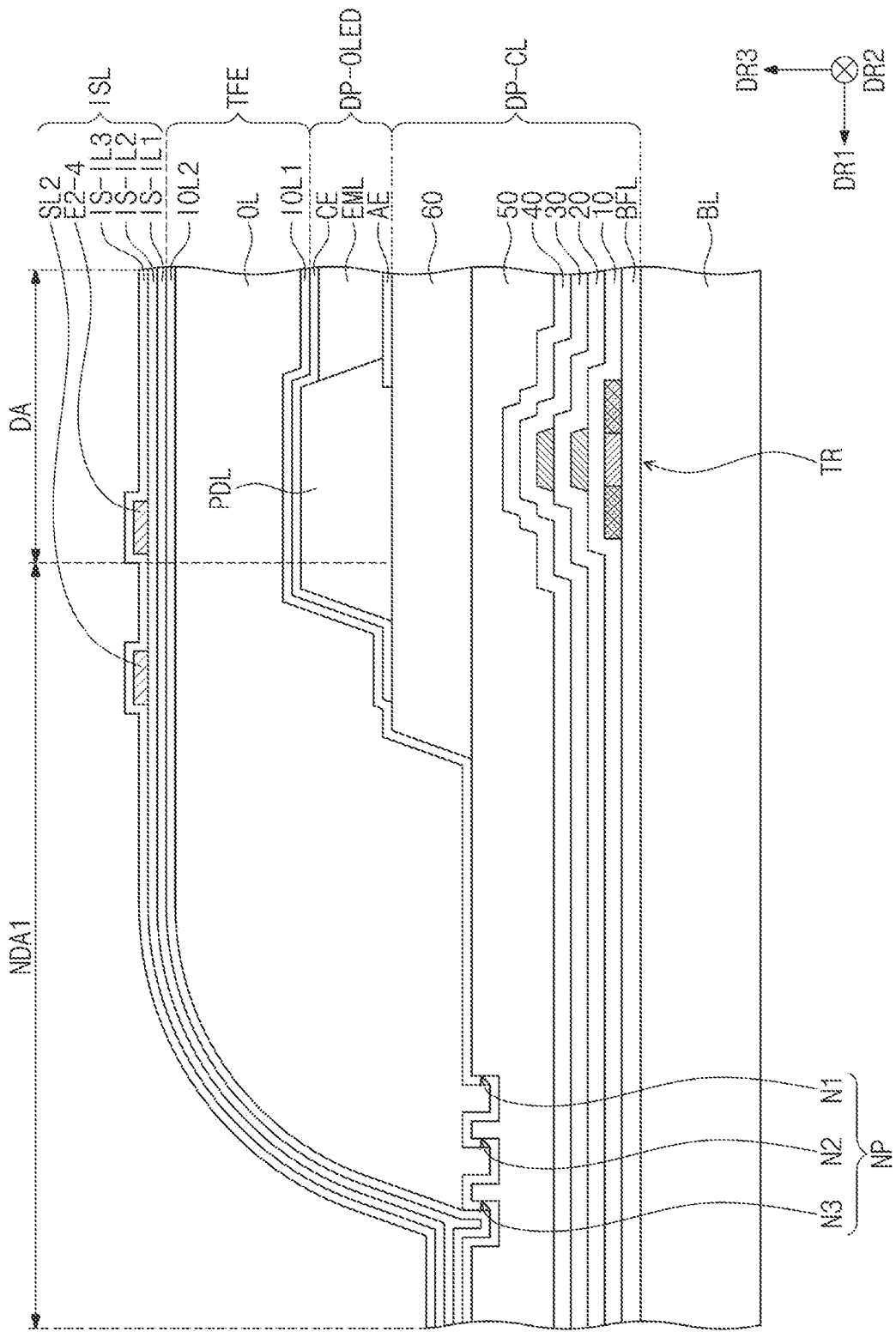
FIG. 7B is an enlarged cross-sectional view of a portion of a display device according to some embodiments of the present disclosure.
Figure 7C:
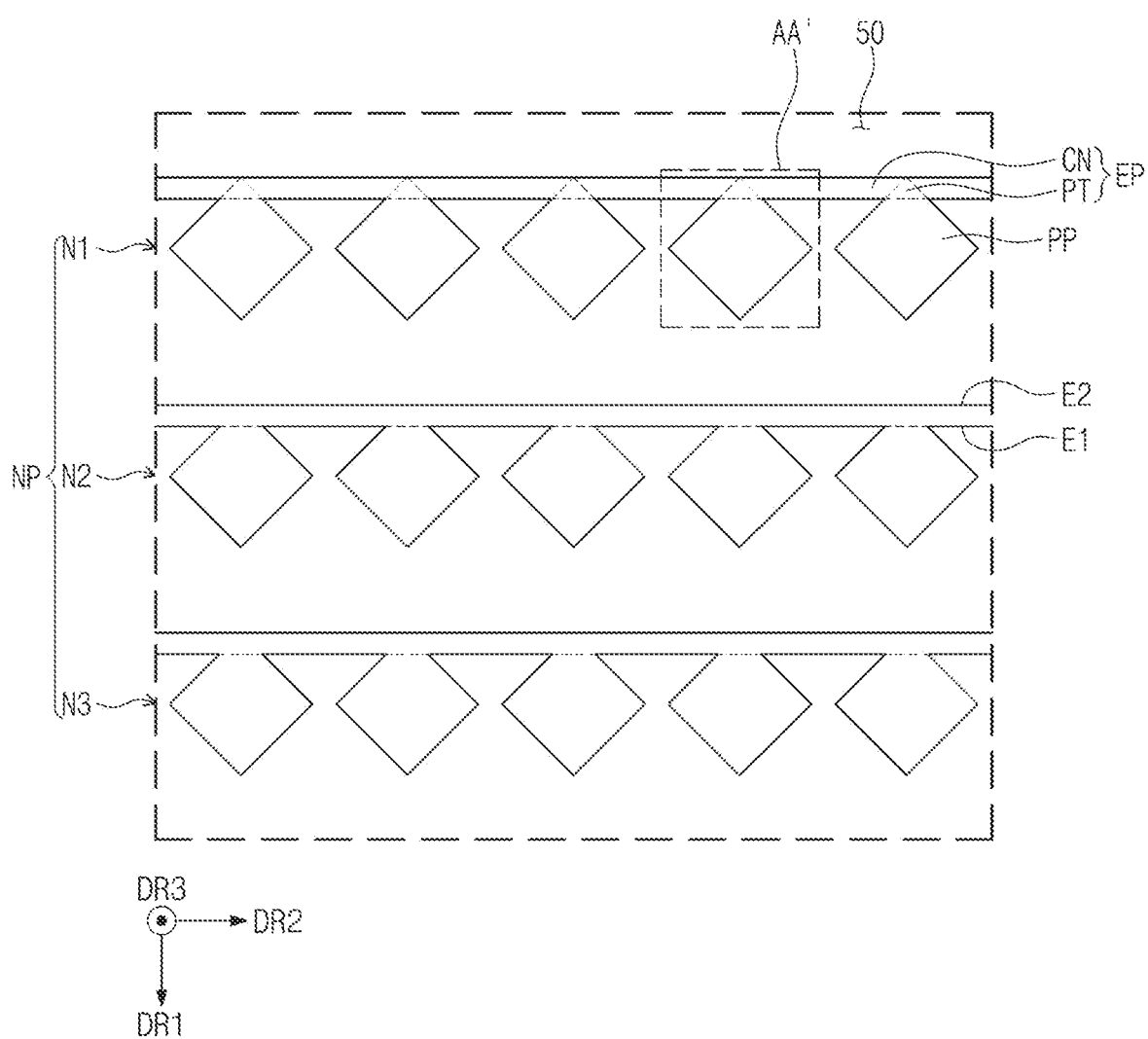
FIG. 7C is an enlarged plan view of a portion of a display device according to some embodiments of the present disclosure.
Figure 7D:
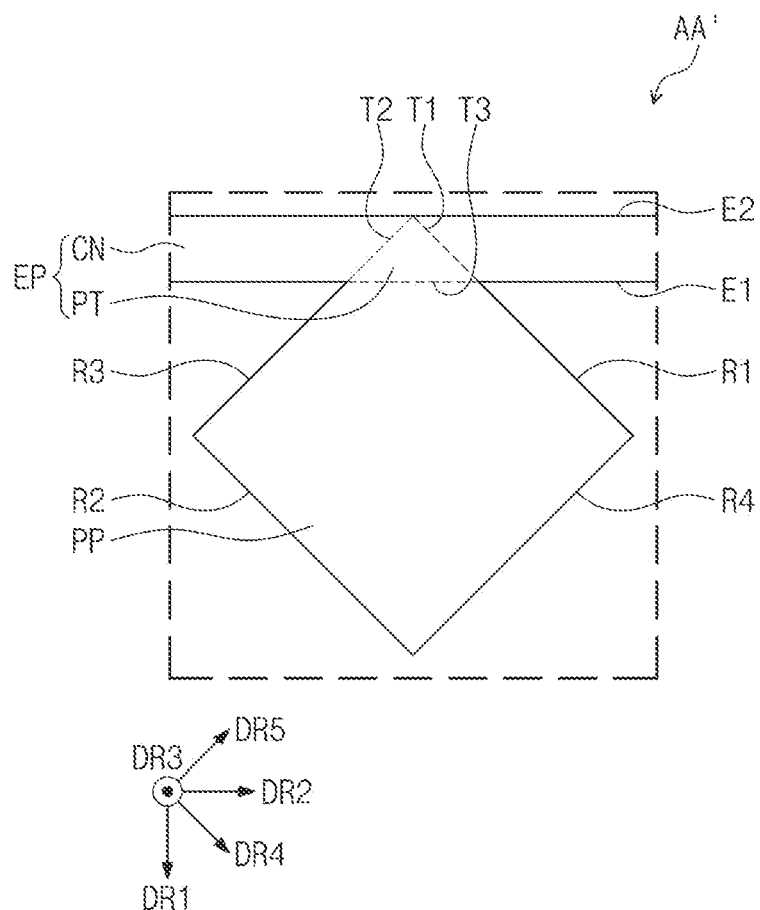
FIG. 7D is an enlarged plan view of an area AA' of FIG. 7C.
Figure 7E:
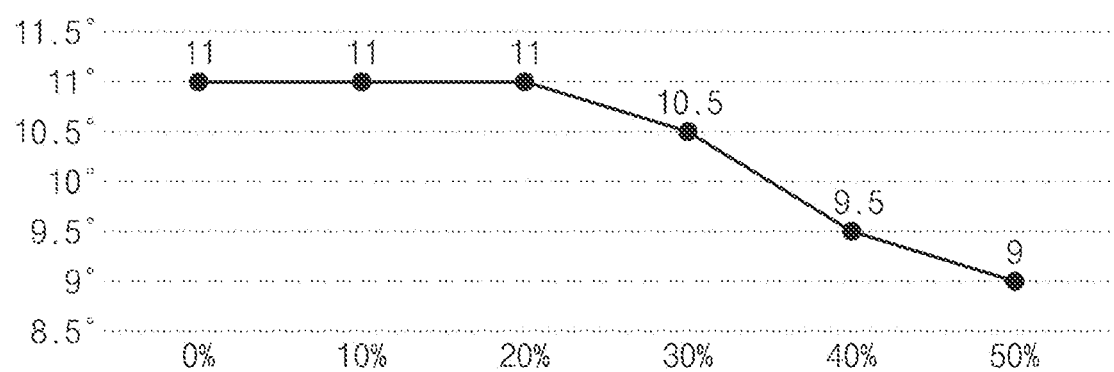
FIG. 7E is a graph of a contact angle of some configurations of a display device according to some embodiments of the present disclosure.

FIG. 7A is a cross-sectional view of the display device DD taken along a line I-I' of FIG. 6. FIG. 7B is an enlarged cross-sectional view of a portion of the display device DD according to some embodiments of the present disclosure. FIG. 7C is an enlarged plan view of a portion of the display device DD according to some embodiments of the present disclosure. FIG. 7D is an enlarged plan view of an area AA' of FIG. 7C. FIG. 7E is a graph of a contact angle of some configurations of the display device DD according to some embodiments of the present disclosure.

Referring to FIG. 7A, the display device DD may include the display panel DP and the input sensor ISL. A display area DA of FIG. 7A may correspond to the display area DP-DA (refer to FIG. 3) of the display panel DP and the sensing area IS-DA (refer to FIG. 6) of the input sensor ISL.

Non-display areas NDA1 and NDA2 of FIG. 7A may correspond to the non-display area DP-NDA (refer to FIG. 3) of the display panel DP and the non-sensing area IS-NDA (refer to FIG. 6) of the input sensor ISL. The non-display areas NDA1 and NDA2 shown in FIG. 7A may correspond to a non-display area, which extends from the display area DA to a right side, of the non-display area NDA shown in FIG. 2, and for the convenience of explanation, the non-display areas NDA1 and NDA2 are respectively shown as an inner non-display area NDA1 included in the first non-bending area NBA1 and a peripheral non-display area NDA2 included in the bending area BA and the second non-bending area NBA2.

The display panel DP may include the base layer BL, the circuit element layer DP-CL, the display element layer DP-OLED, and the thin film encapsulation layer TFE. According to some embodiments, the hole control layer HCL (refer to FIG. 4) and the electron control layer ECL (refer to FIG. 4) may be included in the display element layer DP-OLED. Because a stack structure of the circuit element layer DP-CL and the display element layer DP-OLED located in the display area DA is the same as that of FIG. 4, details thereof are omitted. A stack structure of the input sensor ISL is the same as that of FIG. 6, and thus, details thereof are omitted. FIG. 7A shows one opening E-OP defined through the lower electrode E2-4 having the mesh shape as a representative example, and a portion of the second signal line SL2, which overlaps the first non-bending area NBA1, is shown as a representative example.

According to some embodiments, an end of the pixel definition layer PDL and an end of the sixth insulating layer 60 may be located in the inner non-display area NDA1. The fifth insulating layer 50 may extend from the first non-bending area NBA1 to the second non-bending area NBA2, and the fifth insulating layer 50 may be located in the bending area BA.

Accordingly, in the inner non-display area NDA1, a portion of the first inorganic layer IOL1 may be located directly on the sixth insulating layer 60, and the other portion of the first inorganic layer IOL1 may be located directly on the fifth insulating layer 50.

According to some embodiments of the present disclosure, the organic layer OL may be encapsulated by the first inorganic layer IOL1 and the second inorganic layer IOL2. The first inorganic layer IOL1 and the second inorganic layer IOL2 may be in contact with each other in the inner non-display area NDA1.

According to some embodiments, the organic layer OL may be formed by the inkjet process. As an example, a droplet including an organic material may be provided in the display area DA and the inner non-display area NDA1 adjacent to one side of the display area DA, and the provided droplet may flow to a direction away from the display area DA. In this case, when the provided droplet flows to the bending area BA, a function of the thin film encapsulation layer TFE, which encapsulates and protects the light emitting element OLED from foreign substances, may not be performed. In addition, as a thickness of the display panel DP in the bending area BA increases, the display panel DP may not be bent smoothly, and a defect may occur in the display device DD.

According to some embodiments, the fifth insulating layer 50 may include the engraved pattern NP. However, a position of the engraved pattern NP should not be particularly limited. According to some embodiments of the present disclosure, the engraved pattern NP may control the flow of the droplet so that the provided droplet does not overflow to the bending area BA, and thus, an end of the droplet may be formed in the inner non-display area NDA1. The engraved pattern NP will be described in more detail later.

An inorganic layer may not be located in the bending area BA. An opening I-OP may be defined through the first to fourth insulating layers 10 to 40 in the bending area BA. The opening I-OP may extend to the buffer layer BFL. The opening I-OP may be formed by an etching process after the first to fourth insulating layers 10 to 40 are formed. A portion of the fifth insulating layer 50 may be located in the opening I-OP.

According to some embodiments, a bending protective layer BPL may be located on the fifth insulating layer 50 in the bending area BA. The bending protective layer BPL may cover the bending area BA, may protect the bending area BA from external impacts, and may allow a neutral surface to be formed in the display panel DP, and thus, a reliability of the display device DD may be improved.

Inorganic layers may be stacked in the second non-bending area NBA2. In particular, the first to fourth insulating layers 10 to 40 and the first sensing insulating layer IS-IL1 may be located in the pad area NDA-PD.

The pad part SL-P of the first signal lines SL1 and a pad electrode ISL-PD connected to the pad part SL-P may be located in the pad area NDA-PD. FIG. 7A schematically shows a portion of the signal line including the pad part SL-P and the line part SL-L connected to the pad part SL-P.

FIG. 7B is an enlarged cross-sectional view of a portion of the first non-bending area NBA1 of FIG. 7A. For example, FIG. 7B shows the inner non-display area NDA1 and a portion of the display area DA adjacent to the inner non-display area NDA1. In FIG. 7B, the same/similar reference numerals denote the same/similar elements in FIG. 7A, and thus, detailed descriptions of the same/similar elements will be omitted.

Referring to FIG. 7B, the fifth insulating layer 50 may include the engraved pattern NP. FIG. 7B shows a portion of the engraved pattern NP taken along the line I-I' extending in the first direction DR1.

The engraved pattern NP may be formed by removing at least a portion of the fifth insulating layer 50 in the thickness direction. FIG. 7B shows the engraved pattern NP formed by removing the portion of the fifth insulating layer 50 as a representative example, however, the engraved pattern NP may be formed penetrating through the fifth insulating layer 50 in the thickness direction or may be formed by removing a portion of the insulating layers located under the fifth insulating layer 50 together with the portion of the fifth insulating layer 50.

In addition, the engraved pattern NP may be defined through one of the first to sixth insulating layers 10 to 60 of the circuit element layer DP-CL and may be defined through the pixel definition layer PDL. That is, layers on which the engraved pattern NP is formed should not be particularly limited to any one, and the engraved pattern NP may be included as long as it is located below a spread path of the organic material.

According to some embodiments, the engraved pattern NP may be provided in plural. The engraved patterns NP may include a first engraved pattern N1, a second engraved pattern N2, and a third engraved pattern N3. The first, second, and third engraved patterns N1, N2, and N3 may be arranged spaced apart from each other in a direction away from the display area DA, i.e., the first direction DR1. FIG. 7B shows three engraved patterns NP as a representative example, however, the number of the engraved patterns should not be particularly limited.

As the first inorganic layer IOL1 is located directly on the fifth insulating layer 50 in the inner non-display area NDA1, the engraved patterns NP may be in contact with the first inorganic layer IOL1 while being covered by the first inorganic layer IOL1. As the first inorganic layer IOL1 is provided as a thin layer, a concave pattern shape of the engraved patterns NP may be maintained.

The organic layer OL may cover at least a portion of the engraved patterns NP. According to some embodiments, the organic layer OL may cover the first engraved pattern N1 and the second engraved pattern N2, and an end of the organic layer OL may be aligned with an end of the third engraved pattern N3 adjacent to the second engraved pattern N2, however, they should not be limited thereto or thereby. According to some embodiments, the number of the engraved patterns covered by the organic layer OL may be changed depending on the number of the engraved patterns, the material of the organic layer OL, and an amount of the droplet.

FIG. 7C is an enlarged plan view of a portion of the fifth insulating layer 50 in which the engraved patterns NP are defined.

Referring to FIG. 7C, the engraved patterns NP may include the first, second, and third engraved patterns N1, N2, and N3. According to some embodiments, each of the engraved patterns NP may include an extension portion EP and protruding portions PP.

The extension portion EP may extend in a direction (hereinafter, referred to as an extension direction) along one side of the display area DA. The extension portion EP may include first extension sides E1 respectively extending from the protruding portions PP and located between the protruding portions PP and a second extension side E2 facing the first extension sides E1.

The extension portion EP may include pattern portions PT and connection portions CN. The pattern portions PT and the connection portions CN may be alternately arranged with each other in the extension direction (the second direction DR2).

The protruding portions PP may protrude from the extension portion EP to a direction (hereinafter, referred to as a cross direction) away from the display area DA. The protruding portions PP may be arranged spaced apart from each other in the extension direction.

FIG. 7C shows the engraved patterns NP extending along the one side of the display area DA adjacent to the bending area BA, the extension direction may be the second direction DR2, and the cross direction may be the first direction DR1. Accordingly, the extension portion EP may extend in the second direction DR2, and the protruding portions PP may protrude from the extension portion EP to the first direction DR1 and may be arranged in the second direction DR2.

However, they should not be limited thereto or thereby. In a case where each of the engraved patterns NP extends along one side of the display area DA, which extends in the first direction DR1, the extension direction may be the first direction DR1, and the cross direction may be the second direction DR2. Hereinafter, the embodiments in which the extension direction is the second direction DR2 and the cross direction is the first direction DR1 will be described as a representative example.

According to some embodiments, a maximum width in the extension direction (the second direction DR2) of each of the protruding portions PP may be equal to or smaller than about 100 micrometers. In a case where the maximum width in the extension direction of each of the protruding portions PP is greater than about 100 micrometers, its ability to improve the contact angle formed by the end of the droplet and to control the spread of the droplet may not be sufficient.

According to some embodiments, protruding portions PP of the first engraved pattern N1, protruding portions PP of the second engraved pattern N2, and protruding portions PP of the third engraved pattern N3 may be aligned with each other in the cross direction (the first direction DR1). That is, each of the protruding portions PP of the second engraved pattern N2 may overlap a corresponding protruding portion among the protruding portions PP of the first engraved pattern N1 in the cross direction (the first direction DR1). Each of the protruding portions PP of the third engraved pattern N3 may overlap a corresponding protruding portion among the protruding portions PP of the second engraved pattern N2 in the cross direction (the first direction DR1).

Each of the pattern portions PT may extend from a protruding portion adjacent thereto among the protruding portions PP. According to some embodiments, a combined shape of one pattern portion among the pattern portions PT with the protruding portion extending from the one pattern portion (hereinafter, referred to as a pattern portion and a protruding portion, which correspond to each other) may have a variety of polygonal shapes. Hereinafter, this will be described in more detail with reference to FIG. 7D.

FIG. 7D is an enlarged plan view of one protruding portion PP and the extension portion EP adjacent to the protruding portion PP of the engraved pattern.

Each of the protruding portions PP may include first and second sides R1 and R2 extending in a fourth direction DR4 that is an oblique direction with respect to the first and second directions DR1 and DR2 and third and fourth sides R3 and R4 extending in a fifth direction DR5 crossing the fourth direction DR4.

Each of the first side R1 and the third side R3 may extend from the extension portion EP. The second side R2 may extend from one end of the third side R3 spaced apart from the extension portion EP, and the fourth side R4 may extend from one end of the first side R1 spaced apart from the extension portion EP to one end of the second side R2.

Each of the pattern portions PT may include a first imaginary line T1, a second imaginary line T2, and a third imaginary line T3. The first imaginary line T1 may extend from the other end of the first side R1 adjacent to the extension portion EP to the second extension side E2 along a direction opposite to the fourth direction DR4. The second imaginary line T2 may extend from the other end of the third side R3 adjacent to the extension portion EP to the second extension side E2 along the fifth direction DR5. The third imaginary line T3 may correspond to a boundary between the pattern portion and the protruding portion, which correspond to each other. The third imaginary line T3 may extend from the other end of the first side R1 to the other end of the third side R3.

According to some embodiments, the first to fourth sides R1 to R4 and the third imaginary line T3 may define a pentagonal shape, and the first to third imaginary lines T1 to T3 may form a triangular shape. The first, second, third, and fourth sides R1, R2, R3, and R4 and the first and second imaginary lines T1 and T2 may define a lozenge shape. That is, the combined shape of the pattern portion and the protruding portion, which correspond to each other, may be the lozenge shape.

According to some embodiments of the present disclosure, as each of the engraved patterns NP may include micro-scale protruding portions PP, a surface energy of the droplet passing through the protruding portions PP may increase. Accordingly, the contact angle of the end of each droplet may increase. In addition, a degree of spread of the droplet may be reduced.

In this case, as a size of the protruding portions PP decreases, the degree of spread of the droplet may be reduced, and the contact angle may increase. In addition, as the number of protruding portions PP arranged in the cross direction increases, the degree of spread of the droplet may decrease, and the contact angle may increase.

According to the present disclosure, since the extension portion EP connects the ends of the protruding portions PP and extends in the direction crossing the direction to which the droplet spreads, a capillary pressure occurring in the droplet passing through the extension portion EP may decrease.

$$Pc=\gamma(1/Rx+1/Ry) \qquad \text{Equation 1}$$

Equation 1 shows a relationship between the capillary pressure, a capillary diameter, and a capillary depth. $P_c$ denotes the capillary pressure, and $\gamma$ denotes a surface tension of a liquid. $R_x$ denotes the capillary diameter, and $R_y$ denotes the capillary depth. When Equation 1 is applied to the present embodiments, $R_x$ may correspond to a width in the extension direction (the second direction DR2) of the engraved pattern, and $R_y$ may correspond to a depth in the thickness direction of the engraved pattern.

According to some embodiments of the present disclosure, the width in the extension direction of the extension portion of the engraved pattern may be applied infinite value with respect to the droplet passing through the engraved pattern. That is, as an $R_x$ value is applied as an infinite value infinitely, a magnitude of $P_c$ may be reduced.

For example, the protruding portions PP may protrude from the extension portion EP to the cross direction, a portion of the droplet, which is initially in contact with the engraved pattern, may be in contact with the second extension side E2 of the extension portion EP. Accordingly, the possibility that the droplet moves through the extension portion EP may be lowered, and the degree of spread of the droplet may be reduced.

When the inkjet process is performed, in a process in which the droplet spreads in the cross direction away from the display area DA, the droplet may be sagged in the vicinity of a boundary between the display area DA and the inner non-display area NDA1, thereby a recessed portion may be formed in the organic layer OL near the boundary between the display area DA and the inner non-display area NDA1. The sagged portion of the droplet in the display area DA may cause stains to appear in the image displayed through the display surface IS (refer to FIG. 1A), and thus, a visibility may be lowered.

However, according to some embodiments of the present disclosure, as each of the engraved patterns NP includes the micro-scale protruding portions PP and the extension portion EP connected to the protruding portions PP, the contact angle at the end of the droplet may be improved, and the degree of spread of the droplet may be reduced. Accordingly, by preventing or reducing instances of the droplet sagging at the end of the display area DA, the degree of depression of the organic layer OL is reduced or the organic layer OL may not be formed with a recessed portion near the boundary between the display area DA and the inner non-display area NDA1, and thus, a variation in thickness of the droplet may be reduced. Accordingly, instances of a defect in visibility occurring in the end or at the edge of the display area DA may be prevented or reduced, and the visibility of the display device DD may be improved.

In addition, according to some embodiments, when the spread of the droplet stops just before passing through the extension portion EP of any one of the engraved patterns NP, the end of the droplet may be aligned with the second extension side E2 of the extension portion EP and may uniformly extend in the extension direction (the second direction DR2). Accordingly, the variation in thickness of the droplet in the extension direction (the second direction DR2) may be reduced, and thus, the visibility of the display device DD may be improved.

According to some embodiments, each of the connection portions CN may have an area equal to or smaller than about 30% of an area (hereinafter, referred to as a pattern area) of the combined shape of the pattern portion and the protruding portion, which correspond to each other, among the pattern portions PT and the protruding portions PP. Hereinafter, this will be described in more detail with reference to FIG. 7E.

A graph shown in FIG. 7E shows contact angles of the end of the organic layer OL formed on the fifth insulating layer 50 when the engraved patterns NP included in the fifth insulating layer 50 (refer to FIG. 7C) have different ratios of the areas of the connection portions CN (refer to FIG. 7C) with respect to the pattern area.

Referring to the graph shown in FIG. 7E, as the area of each of the connection portions CN increases, the contact angle formed by the end of the organic layer OL aligned along the second extension side E2 of the extension portion EP may be reduced. In a case where the area of each of the connection portions CN is greater than about 30% of the pattern area, the contact angle formed by the end of the organic layer OL may be smaller than about 10.5°. This may be similar to the contact angle formed by the end of the organic layer OL when the micro-scale protruding portions PP are not included in the engraved patterns NP. Accordingly, the contact angle of the organic layer OL may increase when the area of each of the connection portions CN is smaller than about 30% of the pattern area.

Figure 8A:
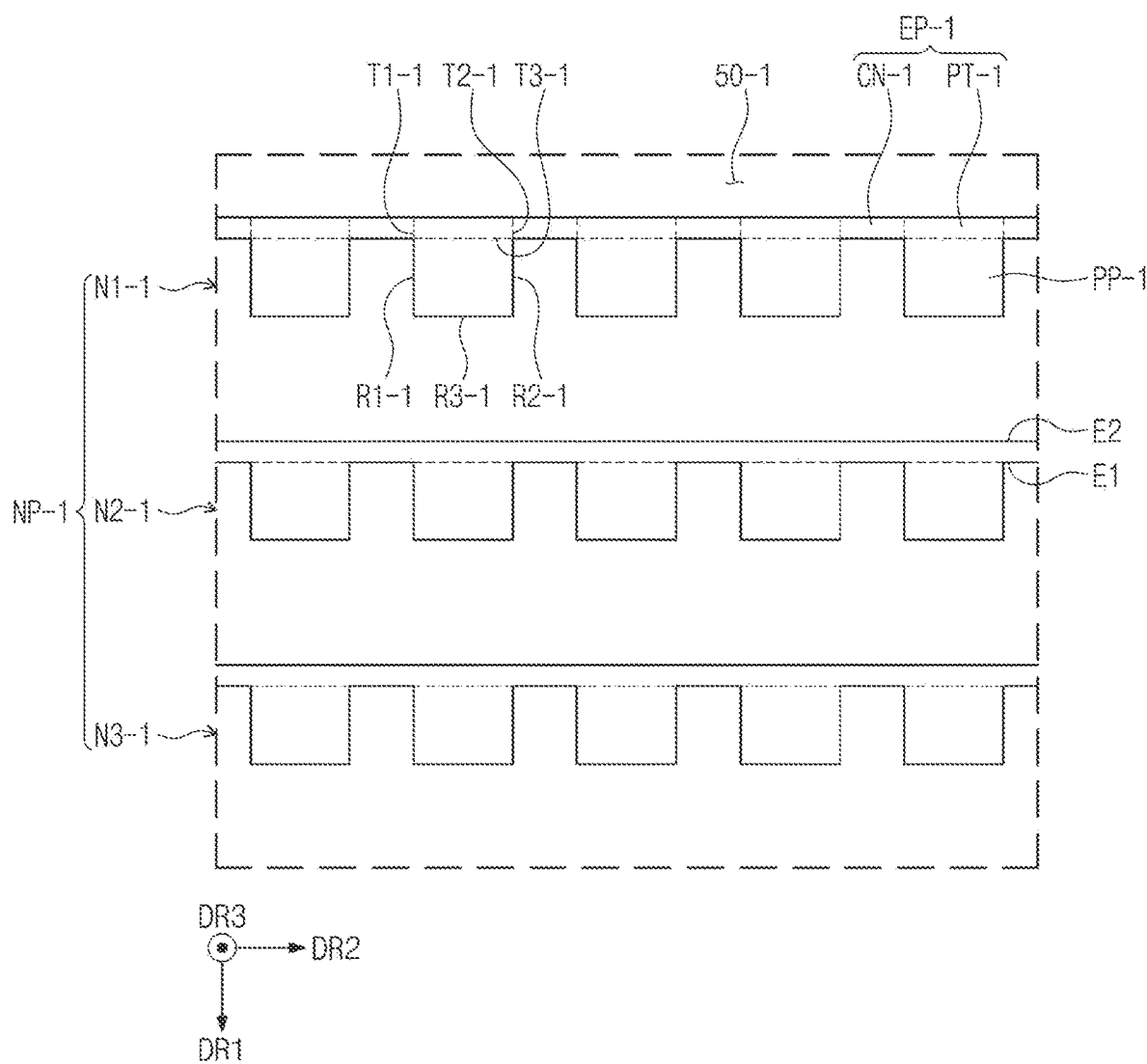
FIG. 8A is an enlarged plan view of a portion of a display device according to some embodiments of the present disclosure.
Figure 8B:
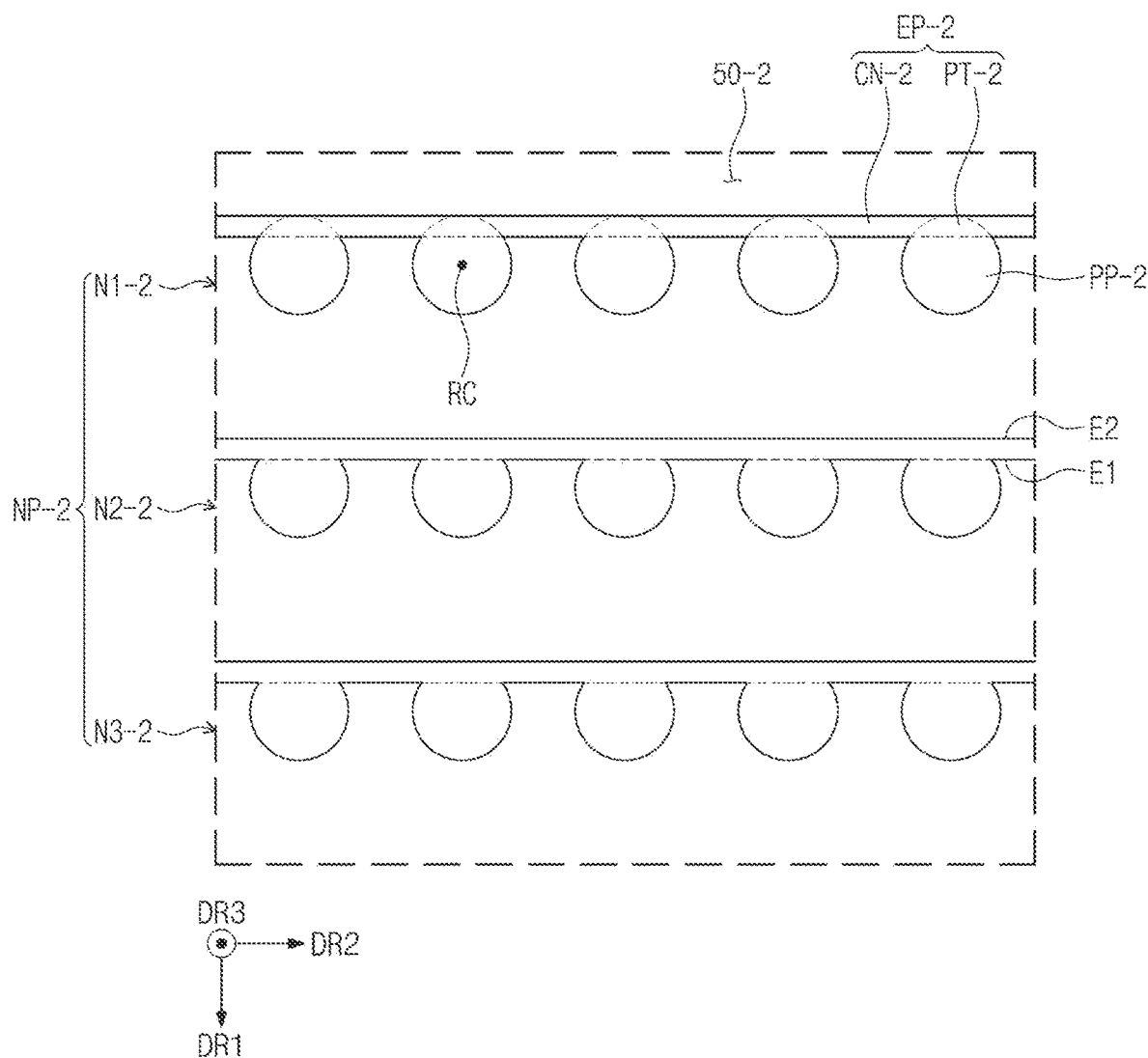
FIG. 8B is an enlarged cross-sectional view of a portion of a display device according to some embodiments of the present disclosure.
Figure 9:
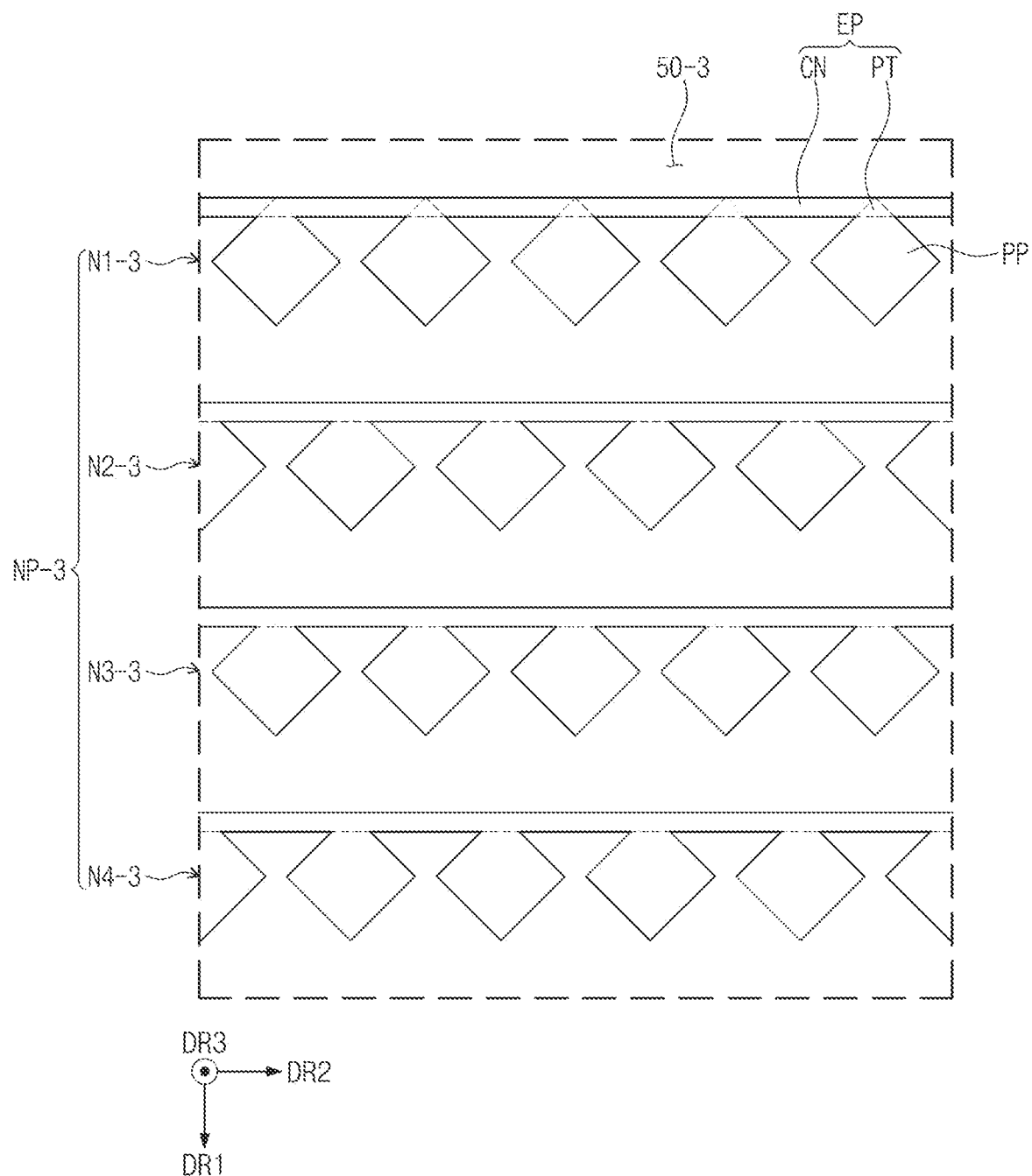
FIG. 9 is an enlarged plan view of a portion of a display device according to some embodiments of the present disclosure.

FIG. 8A is an enlarged cross-sectional view of a portion of a display device according to some embodiments of the present disclosure. FIG. 8B is an enlarged cross-sectional view of a portion of a display device according to some embodiments of the present disclosure. FIG. 9 is an enlarged plan view of a portion of a display device according to some embodiments of the present disclosure. FIGS. 8A, 8B, and 9 are enlarged plan views of engraved patterns NP-1, NP-2, and NP-3 of fifth insulating layers 50-1, 50-2, and 50-3. In FIGS. 8A, 8B, and 9, the same/similar reference numerals denote the same elements in FIGS. 7A to 7E, and thus, detailed descriptions of the same/similar elements will be omitted.

Referring to FIG. 8A, the engraved patterns NP-1 may include first, second, and third engraved patterns N1-1, N2-1, and N3-1. Each of the engraved patterns NP-1 may include an extension portion EP-1 and protruding portions PP-1.

The extension portion EP-1 may include pattern portions PT-1 and connection portions CN-1 alternately arranged with the pattern portions PT-1 in the extension direction (the second direction DR2). The extension portion EP-1 may include first extension sides E1 extending from the protruding portions PP-1 and a second extension side E2 facing the first extension sides E1.

Each of the protruding portions PP-1 may include first and second sides R1-1 and R2-1 extending in the first direction DR1 and a third side R3-1 extending in the second direction DR2. Each of the first side R1-1 and the second side R2-1 may extend from the extension portion EP-1. The third side R3-1 may extend from one end of the first side R1-1 spaced apart from the extension portion EP-1 to one end of the second side R2-1 spaced apart from the extension portion EP-1.

Each of the pattern portions PT-1 may include a first imaginary line T1-1, a second imaginary line T2-1, and a third imaginary line T3-1. The first imaginary line T1-1 may extend from the other end of the first side R1-1 adjacent to the extension portion EP-1 to the second extension side E2 along the direction opposite to the first direction DR1. The second imaginary line T2-1 may extend from the other end of the second side R2-1 adjacent to the extension portion EP-1 to the second extension side E2 along the direction opposite to the first direction DR1. The third imaginary line T3-1 may extend from the other end of the first side R1-1 to the other end of the second side R2-1. The third imaginary line T3-1 may correspond to a boundary between a protruding portion and a pattern portion, which correspond to each other.

According to some embodiments, the first to third sides R1-1 to R3-1 and the third imaginary line T3-1 may define a quadrangular shape. The first to third imaginary lines T1-1 to T3-1 and a portion of the second extension side E2 located between the first imaginary line T1-1 and the third imaginary line T3-1 may define a quadrangular shape. Accordingly, a combined shape of the protruding portion and the pattern portion, which correspond to each other, may be a quadrangular shape, however, it should not be limited thereto or thereby. According to some embodiments, a combined shape of the protruding portion and the pattern portion, which correspond to each other, may be a polygonal shape except the quadrangular shape.

Referring to FIG. 8B, the engraved patterns NP-2 may include first, second, and third engraved patterns N1-2, N2-2, and N3-2. Each of the engraved patterns NP-2 may include an extension portion EP-2 and protruding portions PP-2.

The extension portion EP-2 may include pattern portions PT-2 and connection portions CN-2 alternately arranged with the pattern portions PT-2 in the extension direction (the second direction DR2). The extension portion EP-2 may include first extension sides E1 extending from the protruding portions PP-2 and a second extension side E2 facing the first extension sides E1.

Each of the protruding portions PP-2 may be a portion of a circle having a center of curvature RC defined in a corresponding protruding portion. Each of the pattern portions PT-2 may be the other portion of the circle having the center of curvature RC defined in the corresponding protruding portion. That is, a combined shape of a protruding portion and a pattern portion, which correspond to each other, may be a circular shape.

Referring to FIG. 9, the engraved patterns NP-3 may include first, second, third, and fourth engraved patterns N1-3, N2-3, N3-3, and N4-3. Each of the engraved patterns NP-3 may include an extension portion EP and protruding portions PP.

According to some embodiments, the second engraved pattern N2-3 may be shifted from the first engraved pattern N1-3 to the extension direction (the second direction DR2). Each of the protruding portions PP of the second engraved pattern N2-3 may be located to overlap an area between the protruding portions PP adjacent to each other of the first engraved pattern N1-3 in the cross direction (the first direction DR1).

The first engraved pattern N1-3 and the second engraved pattern N2-3 may be repeatedly arranged. In addition, the fourth engraved pattern N4-3 may be shifted from the third engraved pattern N3-3 to the extension direction (the second direction DR2).

The protruding portions PP of the third engraved pattern N3-3 may overlap a corresponding protruding portion among the protruding portions PP of the first engraved pattern N1-3 in the cross direction (the first direction DR1). The protruding portions PP of the fourth engraved pattern N4-3 may overlap a corresponding protruding portion among the protruding portions PP of the second engraved pattern N2-3 in the cross direction (the first direction DR1).

Figure 10A:
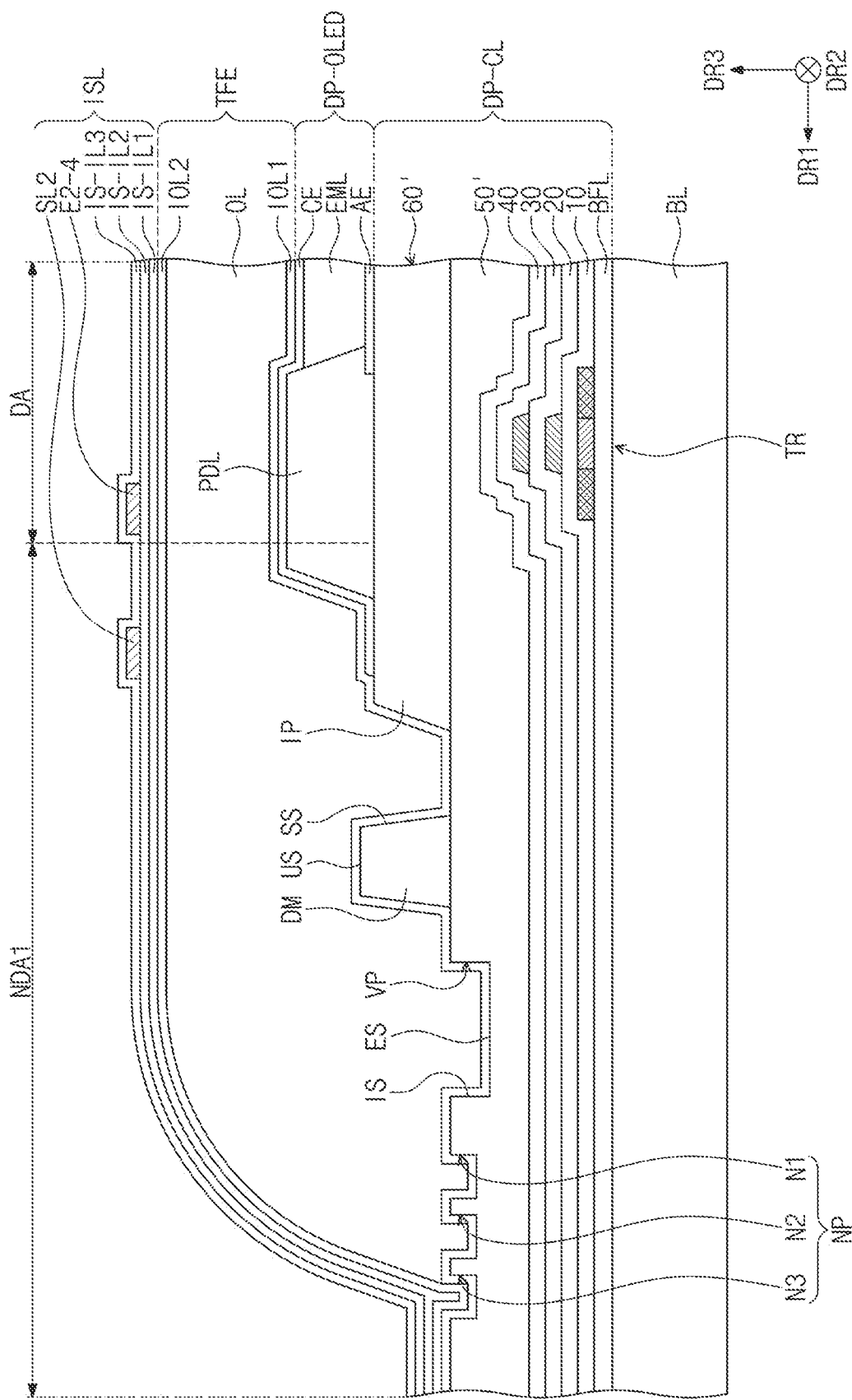
FIGS. 10A and 10B are enlarged cross-sectional views of a portion of a display device according to some embodiments of the present disclosure.
Figure 10B:
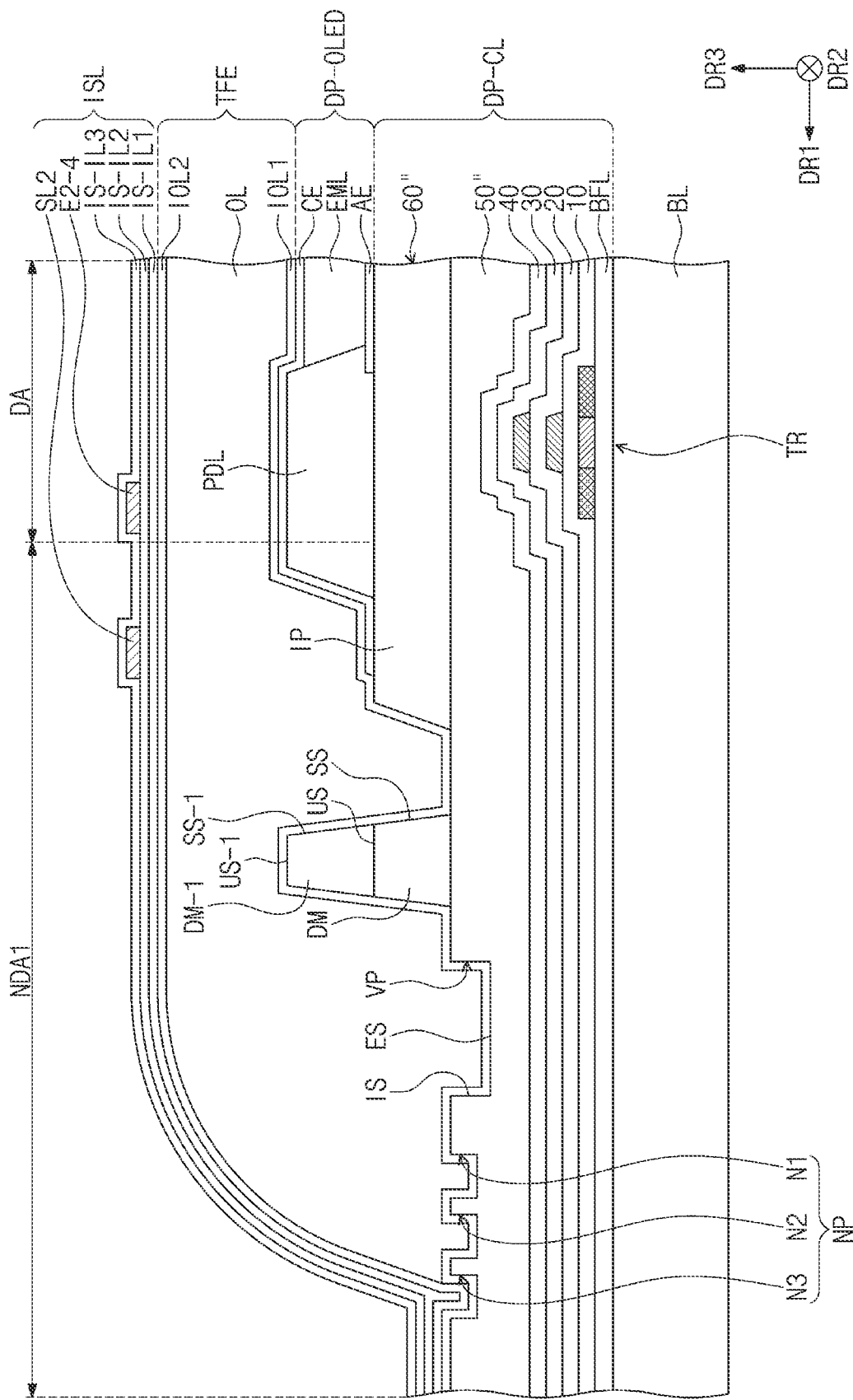

FIG. 10A is an enlarged cross-sectional view of a portion of a display device according to some embodiments of the present disclosure. FIG. 10B is an enlarged cross-sectional view of a portion of a display device according to some embodiments of the present disclosure. FIGS. 10A and 10B are cross-sectional views of a first non-bending area NBA1 (refer to FIG. 7A) taken along a line I-I' of FIG. 6. In FIGS. 10A and 10B, the same/similar reference numerals denote the same elements in FIGS. 1 to 7E, and thus, detailed descriptions of the same/similar elements will be omitted.

Referring to FIG. 10A, a fifth insulating layer 50' (or a first display insulating layer) may include engraved patterns NP and a valley pattern VP. The engraved patterns NP are described with reference to FIGS. 7A to 7E, and thus, some repeated detailed descriptions thereof may be omitted.

The valley pattern VP may have a groove shape formed by removing at least a portion of the fifth insulating layer 50' in the thickness direction, however, embodiments according to the present disclosure are not limited thereto or thereby. According to some embodiments, the valley pattern VP may have an opening shape formed by penetrating through the fifth insulating layer 50' in the thickness direction. In addition, a portion of insulating layers located under the fifth insulating layer 50' may be removed.

The valley pattern VP may extend in the extension direction (the second direction DR2). The valley pattern VP may include an exposed surface ES spaced apart from an upper surface of the fifth insulating layer 50' and an inner side surface IS extending from the exposed surface ES to the upper surface of the fifth insulating layer 50'. FIG. 10A shows a structure in which the inner side surface IS extends vertically from the upper surface of the fifth insulating layer 50' as a representative example, however, according to some embodiments, the inner side surface IS may be inclined with respect to the upper surface of the fifth insulating layer 50' while extending from the upper surface of the fifth insulating layer 50'.

Similar to an extension portion EP (refer to FIG. 7C) of the engraved patterns NP, the valley pattern VP may decrease the capillary pressure and may reduce a probability that a droplet travels through the valley pattern VP. In addition, when the droplet passes through the valley pattern VP, the droplet may be accumulated in an inner space defined by the valley pattern VP, and thus, an amount of the droplet spreading to the cross direction may be reduced.

FIG. 10A shows a structure in which the fifth insulating layer 50' includes one valley pattern VP, however, the number of the valley patterns should not be limited to one. According to some embodiments, the fifth insulating layer 50' may include a plurality of the valley patterns.

FIG. 10A shows a structure in which the fifth insulating layer 50' includes the valley pattern VP and the engraved pattern NP, however, embodiments according to the present disclosure are not limited thereto or thereby. According to some embodiments, the valley pattern VP and the engraved pattern NP may be formed in other insulating layers rather than the fifth insulating layer 50'.

According to some embodiments, a sixth insulating layer 60' (or a second display insulating layer) may include an insulating pattern IP and a dam pattern DM.

The insulating pattern IP may overlap a display area DA and a portion of an inner non-display area NDA1. A lower electrode AE and a pixel definition layer PDL may be located on the insulating pattern IP.

The dam pattern DM may overlap the inner non-display area NDA1 and may be spaced apart from the insulating pattern IP. The dam pattern DM may be located closer to a bending area BA (refer to FIG. 7A) than the insulating pattern IP is. The dam pattern DM may include an upper surface US spaced apart from the upper surface of the fifth insulating layer 50' and a side surface SS extending from the upper surface US to the upper surface of the fifth insulating layer 50'.

According to some embodiments, the side surface SS may be inclined with respect to the fifth insulating layer 50'. A width on a plane of the dam pattern DM may be narrowed in a direction from the fifth insulating layer 50' toward the upper surface US.

As the dam pattern DM is formed as a pattern protruded from the fifth insulating layer 50', the amount of the droplet spreading to the cross direction may be reduced.

FIG. 10A shows a structure in which the sixth insulating layer 60' includes one dam pattern DM, however, it should not be limited thereto or thereby. According to some embodiments, the sixth insulating layer 60' may include a plurality of the dam patterns.

In addition, FIG. 10A shows the structure in which the sixth insulating layer 60' includes the dam pattern DM, however, it should not be limited thereto or thereby. According to some embodiments, the dam pattern DM may be provided as a component of another insulating layer in addition to the sixth insulating layer 60'.

According to some embodiments, the engraved patterns NP may be located spaced apart from the valley pattern VP and the dam pattern DM. The engraved patterns NP may be located closer to the bending area BA (refer to FIG. 7A) than the valley pattern VP and the dam pattern DM are. That is, the engraved patterns NP may be located farthest away from the display area DA.

In this case, the engraved patterns NP may be arranged to be spaced apart from the dam pattern DM with the valley pattern VP interposed therebetween, however, it should not be limited thereto or thereby. According to some embodiments, the engraved patterns NP may be arranged to be spaced apart from the valley pattern VP with the dam pattern DM interposed therebetween.

According to some embodiments, the display device may include the engraved patterns NP, the valley pattern VP, and the dam pattern DM, and thus, the degree of spread of the droplet may be reduced. In addition, when an end of the droplet, i.e., an end of the organic layer OL, is aligned with an end of the extension portion EP (refer to FIG. 7C) as shown in FIG. 10A, a contact angle of the end of the droplet may be improved, and thus, a variation in thickness of the droplet may be reduced.

Referring to FIG. 10B, a circuit element layer DP-CL may include a fifth insulating layer 50" including engraved patterns NP and a valley pattern VP, a sixth insulating layer 60" including an insulating pattern IP and a dam pattern DM, and an additional dam pattern DM-1. The engraved patterns NP, the valley pattern VP, the insulating pattern IP, and the dam pattern DM are described with reference to FIG. 10A, and thus, details thereof will be omitted.

The additional dam pattern DM-1 may be located on the dam pattern DM. The additional dam pattern DM-1 may include an additional upper surface US-1 and an additional side surface SS-1 extending from the additional upper surface US-1 to an upper surface US of the dam pattern DM. The additional side surface SS-1 may be inclined with respect to the upper surface US. A width on a plane of the additional dam pattern DM-1 may be narrowed in a direction from the upper surface US toward the additional upper surface US-1. According to some embodiments, the additional side surface SS-1 may extend from a side surface SS and may have the same inclination as that of the side surface SS.

The additional dam pattern DM-1 may be formed through the same process as a pixel definition layer PDL. Accordingly, the additional dam pattern DM-1 may include the same material as that of the pixel definition layer PDL.

As the display device further includes the additional dam pattern DM-1, a height of a pattern protruded from the fifth insulating layer 50" may increase, and thus, an amount of the droplet spreading to the cross direction may be further reduced.

FIG. 10B shows a structure in which one additional dam pattern DM-1 is located on one dam pattern DM, however, embodiments according to the present disclosure are not limited thereto or thereby. As an example, the additional dam patterns may be further arranged or utilized, or each of the dam pattern DM and the additional dam pattern DM-1 may be provided in plural. In addition, all of the dam pattern DM having a single-layer structure, the dam pattern DM having a multi-layer structure, and the additional dam pattern DM-1 may be located.

Figure 11A:
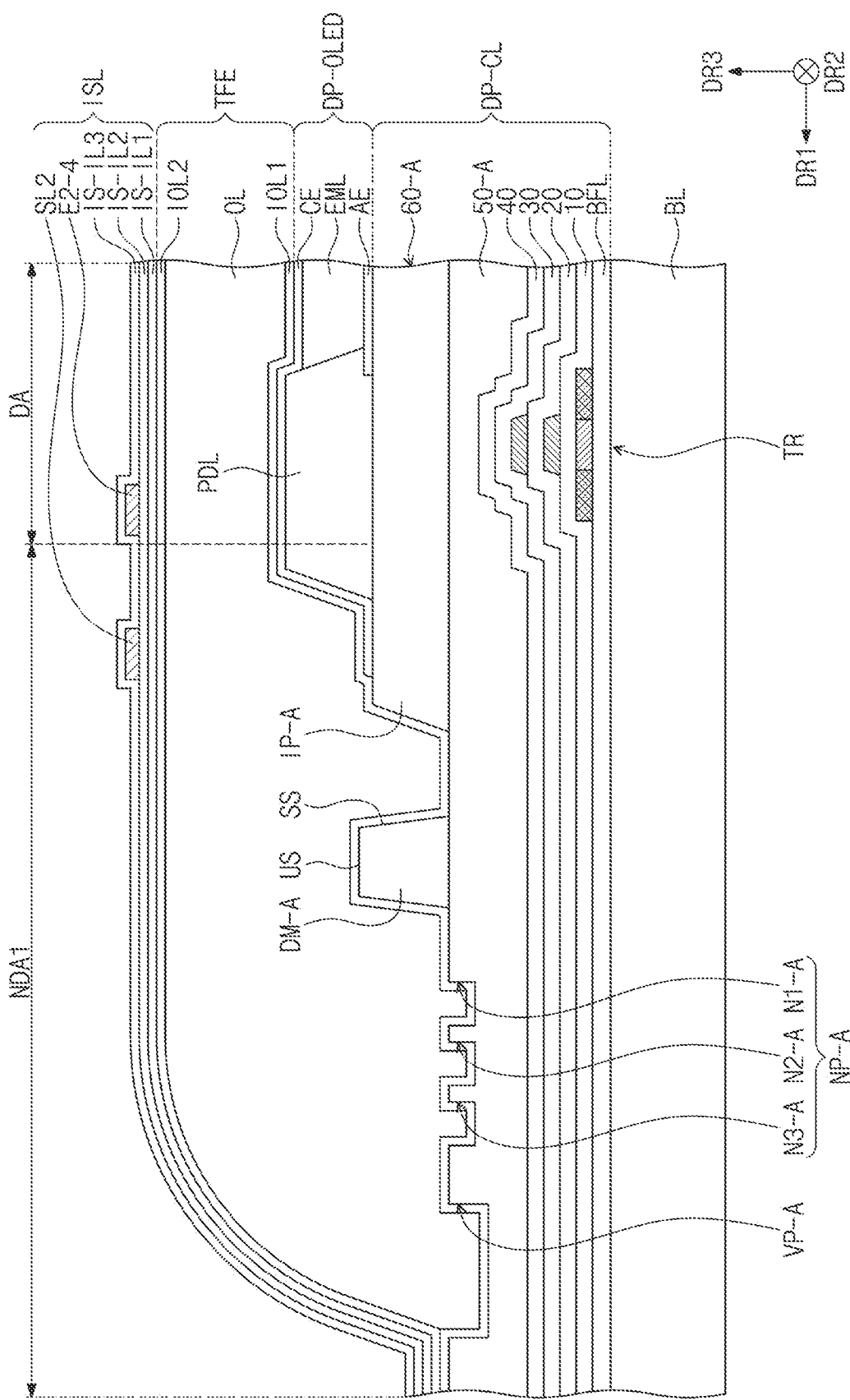
FIGS. 11A and 11B are enlarged cross-sectional views of a portion of a display device according to some embodiments of the present disclosure.
Figure 11B:
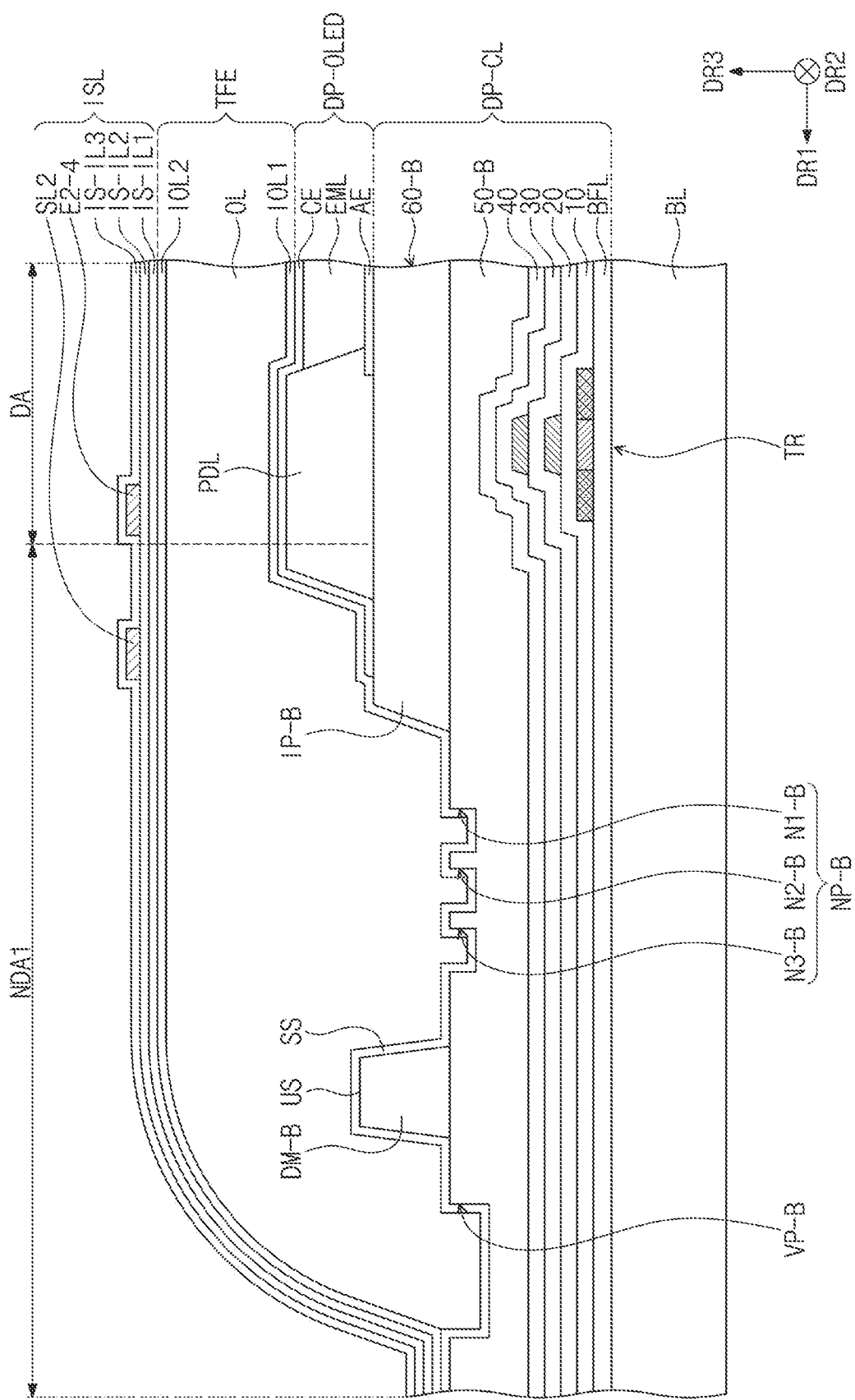

FIG. 11A is an enlarged cross-sectional view of a portion of a display device according to some embodiments of the present disclosure. FIG. 11B is an enlarged cross-sectional view of a portion of a display device according to some embodiments of the present disclosure. FIGS. 11A and 11B are cross-sectional views of a first non-bending area NBA1 (refer to FIG. 7A) taken along a line I-I' of FIG. 6. In FIGS. 11A and 11B, the same/similar reference numerals denote the same elements in FIGS. 1 to 10B, and thus, detailed descriptions of the same/similar elements will be omitted.

Referring to FIG. 11A, a circuit element layer DP-CL may include a fifth insulating layer 50-A including engraved patterns NP-A and a valley pattern VP-A and a sixth insulating layer 60-A including an insulating pattern IP-A and a dam pattern DM-A.

According to some embodiments, the engraved patterns NP-A may be arranged to be spaced apart from the valley pattern VP-A and the dam pattern DM-A. The engraved patterns NP-A may be located between the valley pattern VP-A and the dam pattern DM-A.

As an example, the valley pattern VP-A may be arranged to be closest to a bending area BA (refer to FIG. 7A), and the dam pattern DM-A may be arranged to be closest to a display area DA, however, they should not be limited thereto or thereby. According to some embodiments, the dam pattern DM-A may be arranged to be closest to the bending area BA (refer to FIG. 7A), and the valley pattern VP-A may be arranged to be closest to the display area DA.

According to some embodiments, an organic layer OL may entirely cover the engraved patterns NP-A and the valley pattern VP-A. An end of the organic layer OL may be aligned with an end of the valley pattern VP-A adjacent to the bending area BA.

However, in a case where the spread of the droplet is sufficiently controlled by the engraved patterns NP-A, the organic layer OL may cover a portion of the engraved patterns NP-A, and the end of the organic layer OL may be aligned with an end of one of the engraved patterns NP-A.

Referring to FIG. 11B, a circuit element layer DP-CL may include a fifth insulating layer 50-B including engraved patterns NP-B and a valley pattern VP-B and a sixth insulating layer 60-B including an insulating pattern IP-B and a dam pattern DM-B.

According to some embodiments, the engraved patterns NP-B may be arranged to be spaced apart from the valley pattern VP-B and the dam pattern DM-B. The engraved patterns NP-B may be located closer to one side of a display area DA than the valley pattern VP-B and the dam pattern DM-B are. In this case, the valley pattern VP-B may be located closer to a bending area BA (refer to FIG. 7A) than the dam pattern DM-B is, however, it should not be limited thereto or thereby. According to some embodiments, the dam pattern DM-B may be located closer to the bending area BA than the valley pattern VP-B is.

Figure 12A:
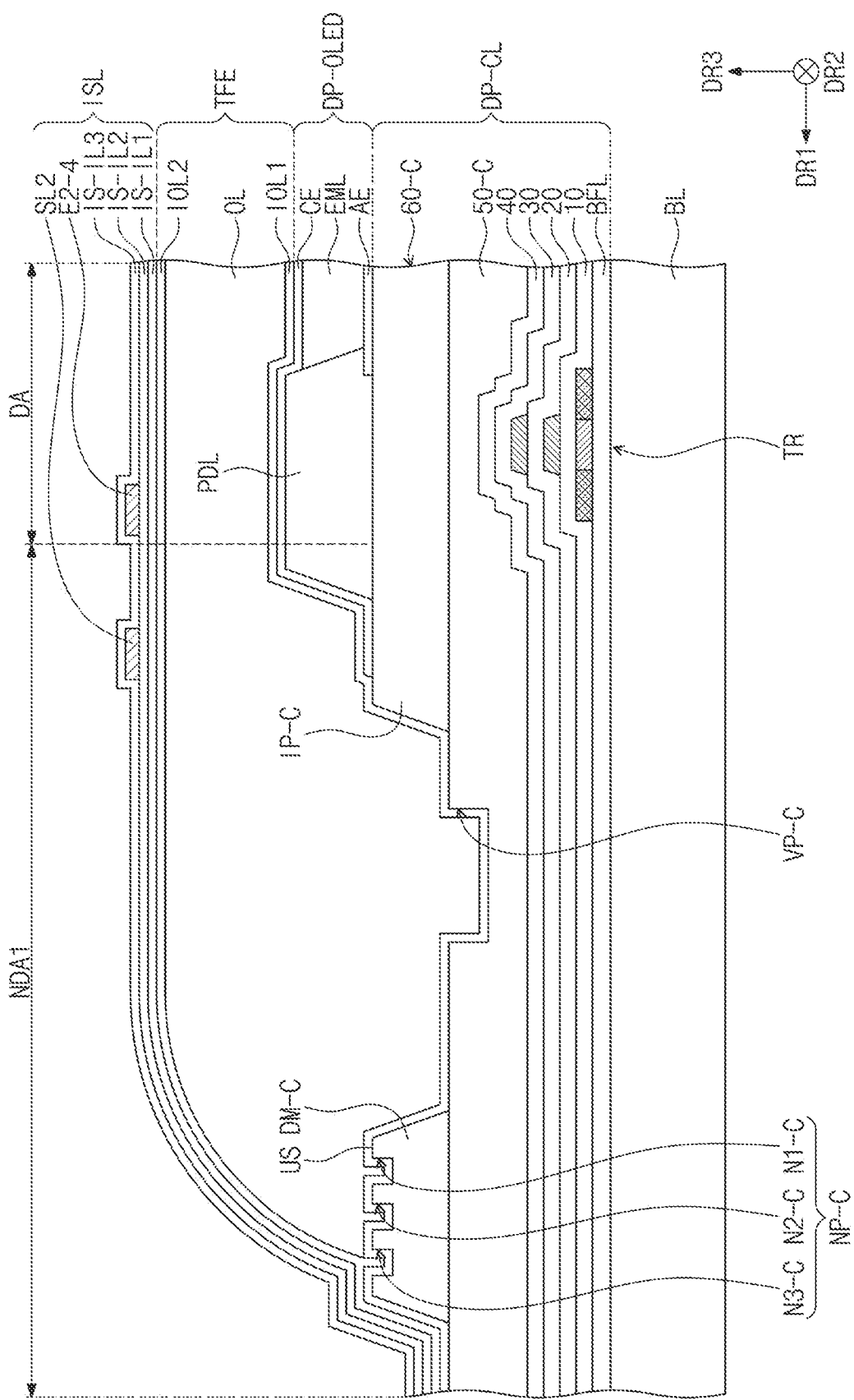
FIGS. 12A and 12B are enlarged cross-sectional views of a portion of a display device according to some embodiments of the present disclosure.
Figure 12B:
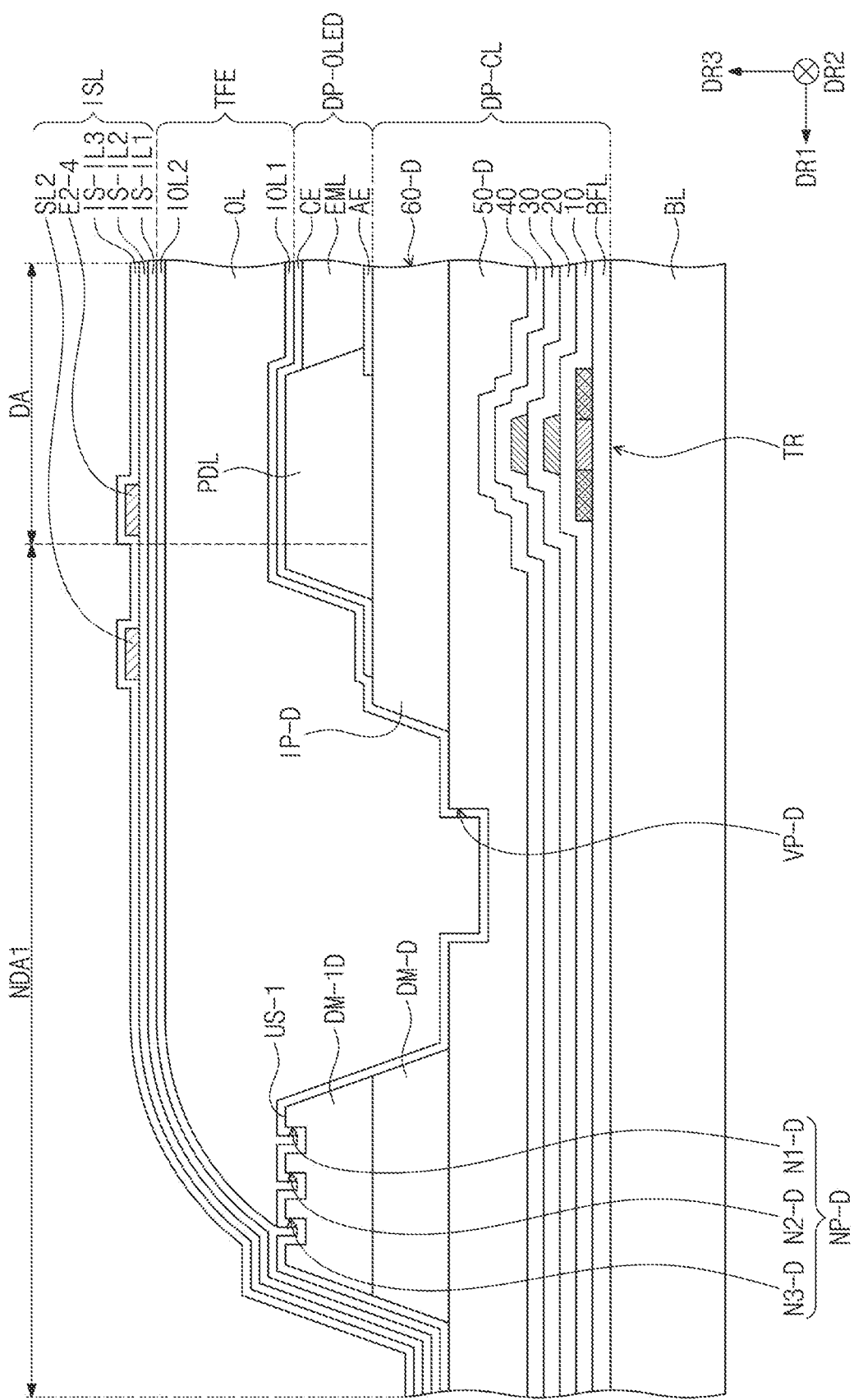

FIG. 12A is an enlarged cross-sectional view of a portion of a display device according to some embodiments of the present disclosure. FIG. 12B is an enlarged cross-sectional view of a portion of a display device according to some embodiments of the present disclosure. FIGS. 12A and 12B are cross-sectional views of a first non-bending area NBA1 (refer to FIG. 7A) taken along a line I-I' of FIG. 6. In FIGS. 12A and 12B, the same/similar reference numerals denote the same elements in FIGS. 1 to 10B, and thus, detailed descriptions of the same/similar elements will be omitted.

Referring to FIG. 12A, a circuit element layer DP-CL may include a fifth insulating layer 50-C including a valley pattern VP-C and a sixth insulating layer 60-C including an insulating pattern IP-C and a dam pattern DM-C. The dam pattern DM-C may be located closer to a bending area BA (refer to FIG. 7A) than the valley pattern VP-C is.

However, according to some embodiments, the valley pattern VP-C may be provided in plural or may be omitted.

According to some embodiments, engraved patterns NP-C may be defined in the dam pattern DM-C. The engraved patterns NP-C may be formed by removing at least a portion of the dam pattern DM-C from an upper surface US of the dam pattern DM-C in the thickness direction. An organic layer OL may cover at least a portion of the engraved patterns NP-C. An end of the organic layer OL may be located on the upper surface US of the dam pattern DM-C and may be aligned with an end of one of the engraved patterns NP-C.

Referring to FIG. 12B, a circuit element layer DP-CL may include a fifth insulating layer 50-D including a valley pattern VP-D, a sixth insulating layer 60-D including an insulating pattern IP-D and a dam pattern DM-D, and an additional dam pattern DM-1D. The dam pattern DM-D and the additional dam pattern DM-1D may be located closer to a bending area BA (refer to FIG. 7A) than the valley pattern VP-D is.

However, according to some embodiments, the valley pattern VP-D may be provided in plural or may be omitted.

According to some embodiments, engraved patterns NP-D may be defined in the additional dam pattern DM-1D. The engraved patterns NP-D may be formed by removing at least a portion of the additional dam pattern DM-1D from an additional upper surface US-1 of the additional dam pattern DM-1D in the thickness direction.

An organic layer OL may cover at least a portion of the engraved patterns NP-D. An end of the organic layer OL may be located on the additional upper surface US-1 of the additional dam pattern DM-1D and may be aligned with an end of one of the engraved patterns NP-D.

Figure 13A:
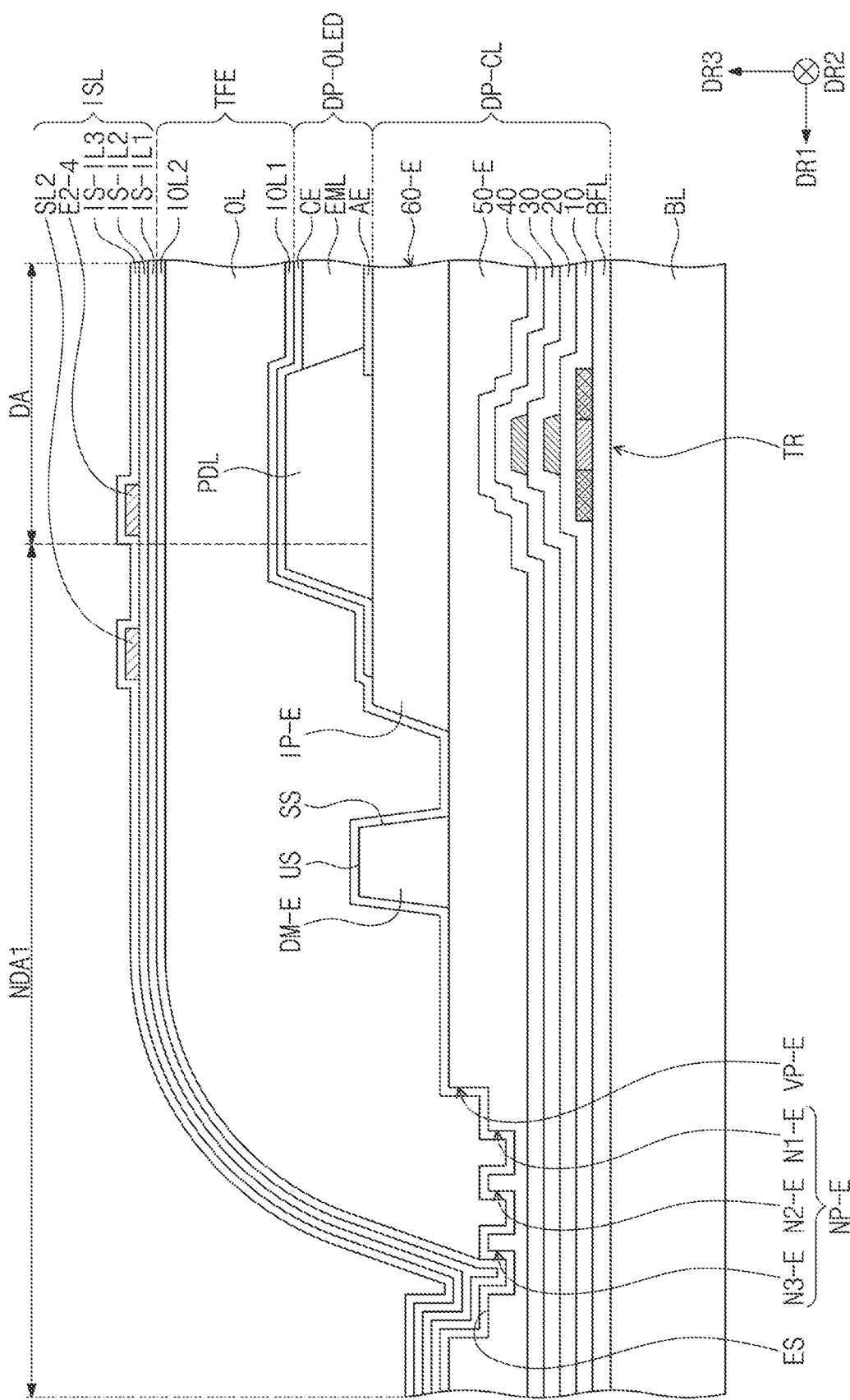
FIG. 13A is an enlarged cross-sectional view of a portion of a display device according to some embodiments of the present disclosure.
Figure 13B:
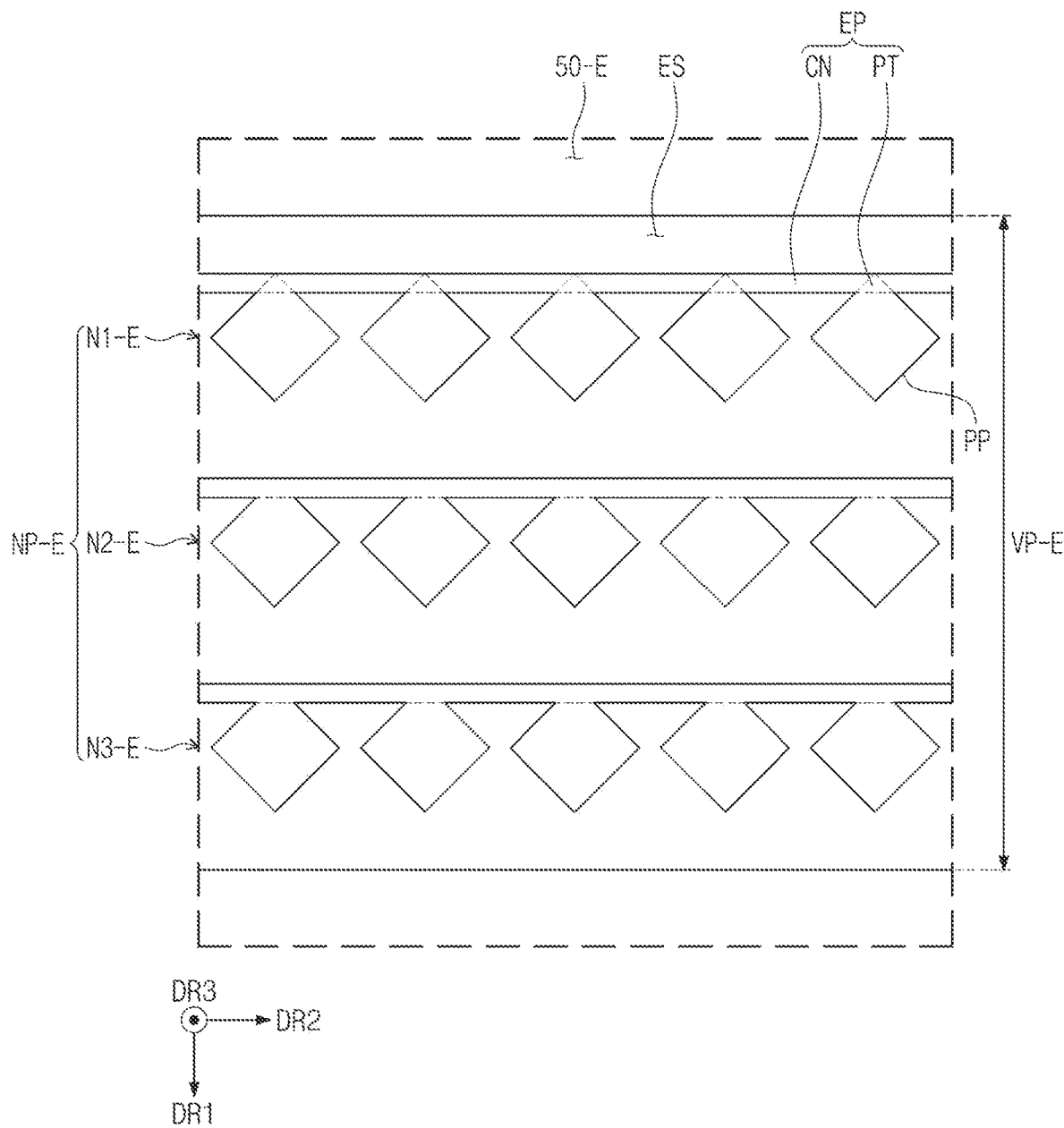
FIG. 13B is an enlarged plan view of a portion of a display device according to some embodiments of the present disclosure.

FIG. 13A is an enlarged cross-sectional view of a portion of a display device according to some embodiments of the present disclosure. FIG. 13B is an enlarged plan view of a portion of the display device according to some embodiments of the present disclosure. FIG. 13A is a cross-sectional view of a first non-bending area NBA1 (refer to FIG. 7A) taken along a line I-I' of FIG. 6. FIG. 13B is an enlarged plan view showing a portion of a valley pattern VP-E. In FIGS. 13A and 13B, the same/similar reference numerals denote the same elements in FIGS. 1 to 10B, and thus, detailed descriptions of the same/similar elements will be omitted.

Referring to FIGS. 13A and 13B, a circuit element layer DP-CL may include a fifth insulating layer 50-E including a valley pattern VP-E and a sixth insulating layer 60-E including an insulating pattern IP-E and a dam pattern DM-E. The valley pattern VP-E may be located closer to a bending area BA (refer to FIG. 7A) than the dam pattern DM-E is.

However, according to some embodiments, the dam pattern DM-E may be provided in plural or may be omitted.

According to some embodiments, engraved patterns NP-E may be defined in the valley pattern VP-E. The engraved patterns NP-E may be formed by further removing at least a portion of the fifth insulating layer 50-E from an exposed surface ES of the valley pattern VP-E in the thickness direction. An organic layer OL may cover at least a portion of the engraved patterns NP-E. An end of the organic layer OL may be located on the exposed surface ES of the valley pattern VP-E and may be aligned with an end of one of the engraved patterns NP-E.

FIG. 13A shows a structure in which the valley pattern VP-E and the engraved patterns NP-E formed in the valley pattern VP-E are provided in a groove form by removing a portion of the fifth insulating layer 50-E as a representative example, however, the present disclosure should not be limited thereto or thereby. As an example, the valley pattern VP-E and the engraved patterns NP-E formed in the valley pattern VP-E may penetrate through the fifth insulating layer 50-E to have an opening form, and a portion of insulating layers located under the fifth insulating layer 50-E may be removed.

Figure 14A:
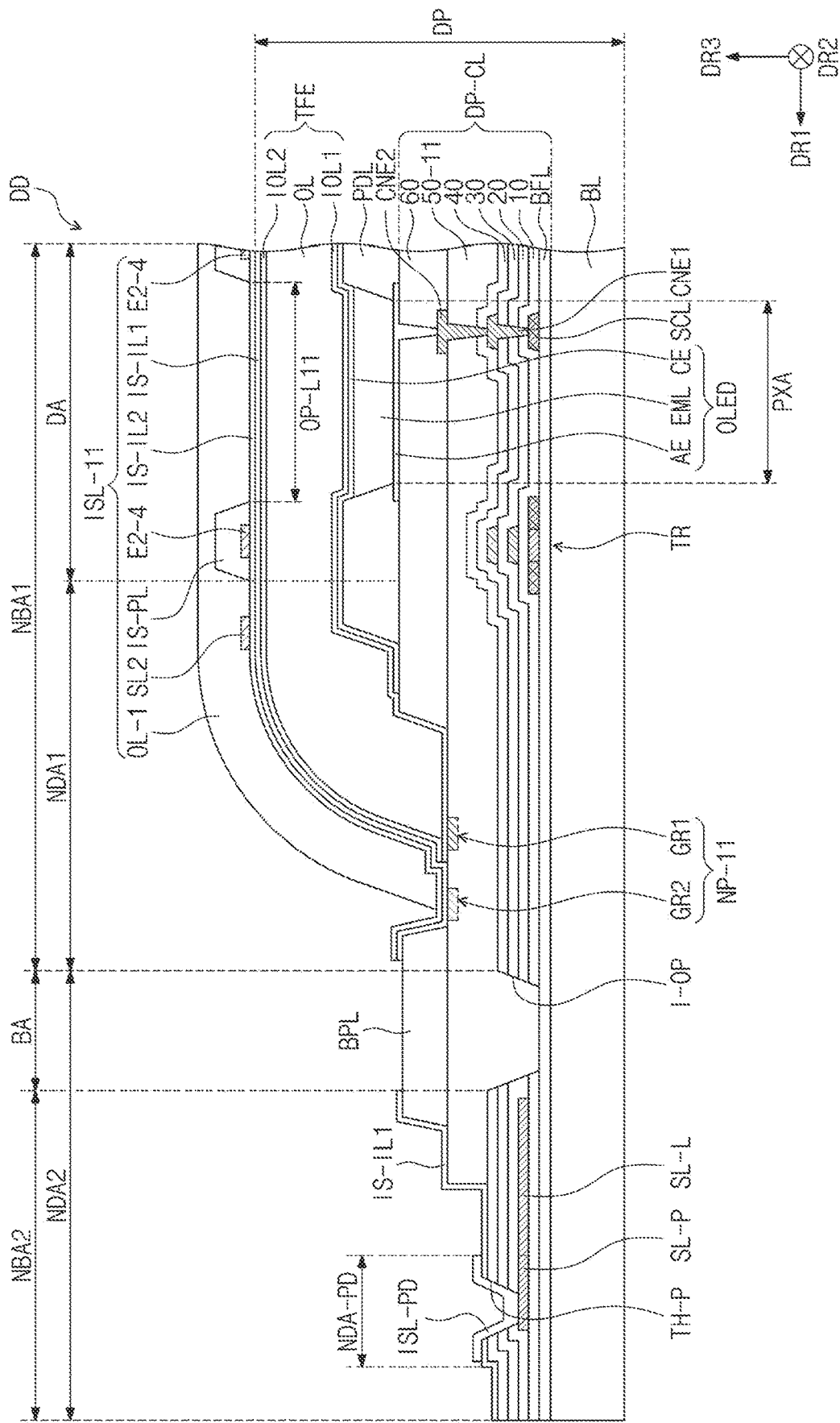
FIG. 14A is an enlarged cross-sectional view of a portion of a display device according to some embodiments of the present disclosure.
Figure 14B:
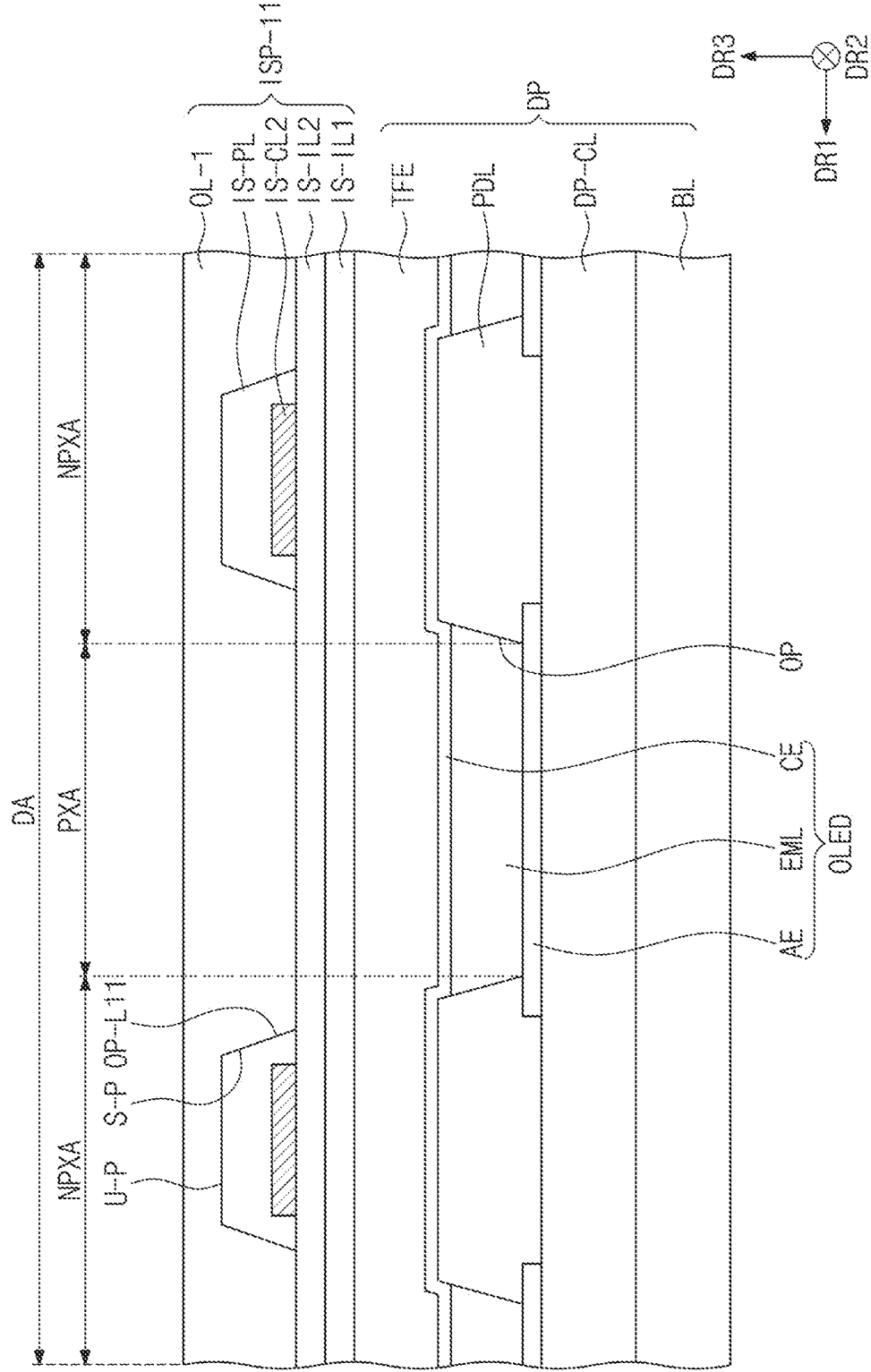
FIG. 14B is an enlarged cross-sectional view of a portion of a display device according to some embodiments of the present disclosure.
Figure 15:
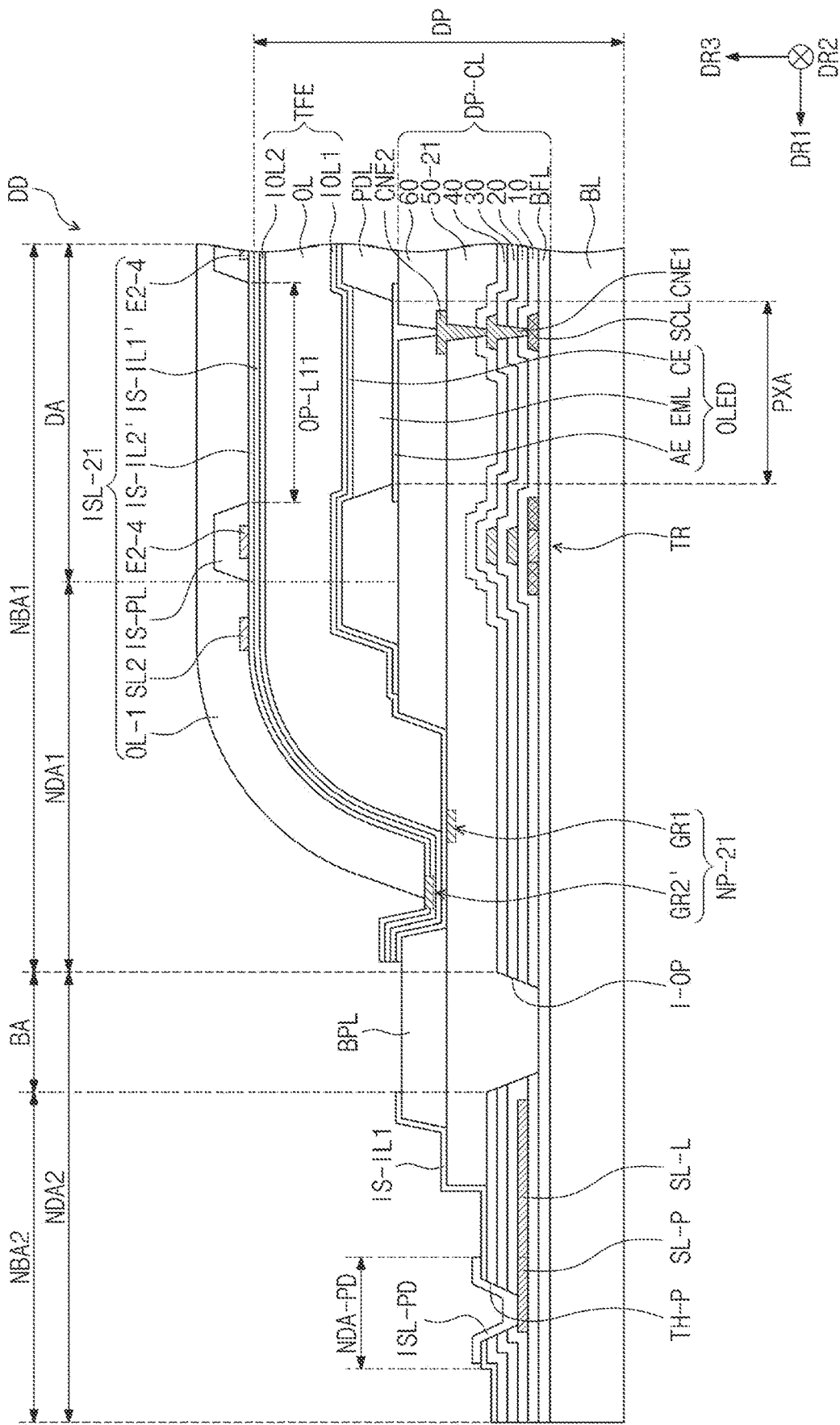
FIG. 15 is an enlarged cross-sectional view of a portion of a display device according to some embodiments of the present disclosure.

FIG. 14A is an enlarged cross-sectional view of a portion of a display device according to some embodiments of the present disclosure. FIG. 14B is an enlarged cross-sectional view of a portion of the display device according to some embodiments of the present disclosure. FIG. 15 is an enlarged cross-sectional view of a portion of a display device according to some embodiments of the present disclosure. FIGS. 14A and 15 are cross-sectional views taken along a line I-I' of FIG. 6. FIG. 14B is an enlarged cross-sectional view of a display area DA of the display device DD. In FIGS. 14A, 14B, and 15, the same/similar reference numerals denote the same elements in FIGS. 1 to 13B, and thus, detailed descriptions of the same/similar elements will be omitted.

Referring to FIGS. 14A and 14B, an input sensor ISL-11 may include a first sensing insulating layer IS-IL1, a second sensing insulating layer IS-IL2, a sensing pattern layer IS-PL, and an additional organic layer OL-1.

A portion of the first sensing insulating layer IS-IL1 may be located on a second inorganic layer IOL2 in a display area DA and an area of an inner non-display area NDA1 adjacent to the display area DA. The other portion of the first sensing insulating layer IS-IL1 may be located on a fifth insulating layer 50-11 in an area of the inner non-display area NDA1 adjacent to a bending area BA. The second sensing insulating layer IS-IL2 may be located on the first sensing insulating layer IS-IL1.

The sensing pattern layer IS-PL may be located on the second sensing insulating layer IS-IL2. The sensing pattern layer IS-PL may be directly in contact with a second conductive pattern layer IS-CL2 and may cover the second conductive pattern layer IS-CL2. The sensing pattern layer IS-PL may be provided with a pattern opening OP-L11 defined therethrough to overlap a light emitting opening OP.

The sensing pattern layer IS-PL may have a trapezoidal shape in a cross-section. Referring to FIG. 14B, the sensing pattern layer IS-PL may include an upper surface U-P and an inclination surface S-P defining the pattern opening OP-L11. The inclination surface S-P may extend from the upper surface U-P of the sensing pattern layer IS-PL to an upper surface of the second sensing insulating layer IS-IL2. The inclination surface S-P may be inclined to form an acute angle with the upper surface of the second sensing insulating layer IS-IL2.

The additional organic layer OL-1 may be located on the second sensing insulating layer IS-IL2. The additional organic layer OL-1 may be directly in contact with the upper surface U-P and the inclination surface S-P of the sensing pattern layer IS-PL and may cover the sensing pattern layer IS-PL.

Each of the sensing pattern layer IS-PL and the additional organic layer OL-1 may have a predetermined refractive index. The refractive index of the additional organic layer OL-1 may be greater than the refractive index of the sensing pattern layer IS-PL. Accordingly, a light emitted from a light emitting element OLED may be totally reflected by a boundary surface between the sensing pattern layer IS-PL and the additional organic layer OL-1. Accordingly, the light emitted from the light emitting element OLED may be condensed in a front direction, so that a light output efficiency of the display device DD may be improved.

According to some embodiments, the refractive index of the sensing pattern layer IS-PL may be equal to or greater than about 1.3 and may be equal to or smaller than about 1.6. The sensing pattern layer IS-PL may include an acrylic-based organic material having the refractive index of about 1.5. As an example, the sensing pattern layer IS-PL may include at least one of ethylhexyl acrylate, pentafluoropropyl acrylate, poly ethylene glycol dimethacrylate, or ethylene glycol dimethacrylate. However, the material for the sensing pattern layer IS-PL should not be limited thereto or thereby.

According to some embodiments, the refractive index of the additional organic layer OL-1 may be equal to or greater than about 1.6 and equal to or smaller than about 1.9. The additional organic layer OL-1 may include an acrylic-based or siloxane-based organic material having the refractive index of about 1.6. As an example, the additional organic layer OL-1 may include at least one of methyltrimethoxysilane, tetramethoxysilane, or polydiarylsiloxane. However, the material for the additional organic layer OL-1 is not limited thereto or thereby.

According to some embodiments, the fifth insulating layer 50-11 may include engraved patterns NP-11. The engraved patterns NP-11 may include a first engraved pattern group GR1 and a second engraved pattern group GR2. The second engraved pattern group GR2 may include engraved patterns located closer to the bending area BA among the engraved patterns NP-11 than the first engraved pattern group GR1 is.

A first inorganic layer IOL1 may be located on the first engraved pattern group GR1, and the first inorganic layer IOL1 may be directly in contact with the first engraved pattern group GR1 while covering the first engraved pattern group GR1. The first inorganic layer IOL1 may be provided as a thin layer, and thus, a concave pattern shape of the engraved patterns included in the first engraved pattern group GR1 among the engraved patterns NP-11 may be maintained.

At least a portion of the first engraved pattern group GR1 may be covered by an organic layer OL. An end of the organic layer OL may be aligned with an end of one of the engraved patterns included in the first engraved pattern group GR1.

The first sensing insulating layer IS-IL1 and the second sensing insulating layer IS-IL2 may be located on the second engraved pattern group GR2, and the first sensing insulating layer IS-IL1 may be directly in contact with the second engraved pattern group GR2 while covering the second engraved pattern group GR2. When each of the first sensing insulating layer IS-IL1 and the second sensing insulating layer IS-IL2 is provided as a thin layer, a concave pattern shape of the engraved patterns included in the second engraved pattern group GR2 among the engraved patterns NP-11 may be maintained.

At least a portion of the second engraved pattern group GR2 may be covered by the additional organic layer OL-1. An end of the additional organic layer OL-1 may be aligned with an end of one of the engraved patterns included the second engraved pattern group GR2.

According to some embodiments, each of the organic layer OL and the additional organic layer OL-1 may be formed by an inkjet process. As an example, a droplet including an organic material may be provided in the display area DA and a inner non-display area NDA1 adjacent to one side of the display area DA, and the provided droplet may flow to a direction away from the display area DA.

According to the present disclosure, the first engraved pattern group GR1 and the second engraved pattern group GR2 may respectively control a flow of the droplet forming the organic layer OL and a flow of the droplet forming the additional organic layer OL-1 and may allow an end of the droplet forming the organic layer OL and an end of the droplet forming the additional organic layer OL-1 to be formed in the inner non-display area NDA1.

Referring to FIG. 15, an input sensor ISL-21 may include a first sensing insulating layer IS-IL1', a second sensing insulating layer IS-IL2', a sensing pattern layer IS-PL, and an additional organic layer OL-1

The first sensing insulating layer IS-IL1' may be directly in contact with a second inorganic layer IOL2 and may be located on the second inorganic layer IOL2. The second sensing insulating layer IS-IL2' may be located on the first sensing insulating layer IS-IL1'. Accordingly, at least a first inorganic layer IOL1, the second inorganic layer IOL2, the first sensing insulating layer IS-IL1', and the second sensing insulating layer IS-IL2' may be located between the additional organic layer OL-1 and a fifth insulating layer 50-21.

According to some embodiments, engraved patterns NP-21 may include a first engraved pattern group GR1 and a second engraved pattern group GR2'. At least a portion of the first engraved pattern group GR1 may be covered by an organic layer OL, and at least a portion of the second engraved pattern group GR2' may be covered by the additional organic layer OL-1.

According to some embodiments, the first engraved pattern group GR1 and the second engraved pattern group GR2' may be located on different layers from each other. In a case where the second engraved pattern group GR2' is defined in the fifth insulating layer 50-21 in the same way as the first engraved pattern group GR1, a plurality of layers may be located between the additional organic layer OL-1 and the fifth insulating layer 50-21, and thus, a concave pattern shape of the engraved patterns NP-21 may not be maintained.

However, according to some embodiments, a process of patterning the second engraved pattern group GR2' may be further performed on the second sensing insulating layer IS-IL2' after an inkjet process to form the organic layer OL is performed and before an inkjet process to form the additional organic layer OL-1 is performed.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the appended claims, and their equivalents.

What is claimed is:

1. A display device comprising:
    a base layer comprising a display area and a non-display area surrounding at least a portion of the display area;
    an insulating layer on the base layer and having an engraved pattern formed by removing at least a portion thereof in a thickness direction to overlap the non-display area;
    a light emitting element overlapping the display area and on the base layer; and
    an organic layer overlapping the display area and the non-display area, covering at least a portion of the engraved pattern, and on the light emitting element, wherein the engraved pattern comprises an extension portion extending in an extension direction along one side of the display area and protruding portions protruding from the extension portion to a cross direction away from the display area and spaced apart from each other.

2. The display device of claim 1, wherein the extension portion comprises pattern portions and connection portions alternately arranged with the pattern portions in the extension direction, each of the pattern portions extending from a protruding portion adjacent thereto among the protruding portions, and a combined shape of a pattern portion and a protruding portion, which correspond to each other, has a polygonal shape or a circular shape.

3. The display device of claim 2, wherein each of the connection portions has an area equal to or smaller than 30% of an area of the combined shape of the pattern portion and the protruding portion, which correspond to each other.

4. The display device of claim 1, wherein a maximum width in the extension direction of each of the protruding portions is equal to or smaller than 100 micrometers.

5. The display device of claim 1, wherein the engraved pattern is provided in plural, and the engraved patterns are spaced apart from each other in the cross direction.

6. The display device of claim 5, wherein the engraved patterns comprise a first engraved pattern and a second engraved pattern, and the protruding portions of the second engraved pattern are aligned with the protruding portions of the first engraved pattern in the cross direction.

7. The display device of claim 5, wherein the engraved patterns comprise a first engraved pattern and a second engraved pattern, the second engraved pattern is shifted from the first engraved pattern in the extension direction, and each of the protruding portions of the second engraved pattern overlaps an area between protruding portions adjacent to each other of the first engraved pattern in the cross direction.

8. The display device of claim 1, wherein the insulating layer is between the base layer and the light emitting element.

9. The display device of claim 1, further comprising a transistor between the base layer and the light emitting element, wherein the insulating layer comprises a first display insulating layer on the transistor and a second display insulating layer on the first display insulating layer, and the second display insulating layer comprises an insulating pattern overlapping the display area and a portion of the non-display area and a dam pattern overlapping the non-display area and spaced apart from the insulating pattern.

10. The display device of claim 9, wherein the engraved pattern is spaced apart from the dam pattern and defined in the first display insulating layer.

11. The display device of claim 10, wherein the first display insulating layer further comprises a valley pattern extending in the extension direction and formed by removing at least a portion of the first display insulating layer, which overlaps the non-display area, in the thickness direction.

12. The display device of claim 11, wherein the engraved pattern is spaced apart from the valley pattern.

13. The display device of claim 12, wherein the engraved pattern is further spaced apart from the one side of the display area than the dam pattern and the valley pattern are.

14. The display device of claim 12, wherein the engraved pattern is between the dam pattern and the valley pattern.

15. The display device of claim 12, wherein the engraved pattern is closer to the one side of the display area than the dam pattern and the valley pattern.

16. The display device of claim 11, wherein the engraved pattern is defined in the valley pattern.

17. The display device of claim 9, wherein the engraved pattern is defined in the dam pattern.

18. The display device of claim 9, further comprising a pixel definition layer, wherein the light emitting element comprises a lower electrode on the insulating layer and an upper electrode on the lower electrode, the pixel definition layer has a light emitting opening defined therethrough to expose at least a portion of the lower electrode, and the insulating layer further comprises an additional dam pattern on the dam pattern and comprising a same material as the pixel definition layer.

19. The display device of claim 18, wherein the engraved pattern is spaced apart from the dam pattern and the additional dam pattern and defined in the first display insulating layer.

20. The display device of claim 18, wherein the engraved pattern is defined in the additional dam pattern.

21. The display device of claim 1, wherein the insulating layer comprises a valley pattern extending in the extension direction of the display area and formed by removing at least a portion of the insulating layer, which overlaps the non-display area, in the thickness direction.

22. The display device of claim 1, further comprising a first inorganic layer between the light emitting element and the organic layer and a second inorganic layer on the organic layer, wherein the first inorganic layer and the second inorganic layer are in contact with each other in the non-display area.

23. The display device of claim 1, further comprising a pixel definition layer, at least one sensing insulating layer, and a sensing pattern layer, wherein the light emitting element comprises a lower electrode and an upper electrode on the lower electrode, the pixel definition layer has a light emitting opening defined therethrough to expose at least a portion of the lower electrode, the sensing insulating layer is between the upper electrode and the organic layer, the sensing pattern layer is on the sensing insulating layer and has a pattern opening defined therethrough to overlap the light emitting opening, the organic layer is on the sensing insulating layer and covers the sensing pattern layer, and the organic layer has a refractive index different from a refractive index of the sensing pattern layer.

24. The display device of claim 1, wherein the base layer comprises a first non-bending area, a bending area, and a second non-bending area, which are sequentially arranged in the cross direction, the bending area is bent with respect to an imaginary axis extending in the extension direction, the display area comprises a portion of the first non-bending area, the non-display area comprises the other portion of the first non-bending area, the bending area, and the second non-bending area, and the engraved pattern is between the one side of the display area and the bending area.

25. A display device comprising:
a base layer comprising a display area and a non-display area surrounding at least a portion of the display area;
a circuit element layer comprising at least one transistor and at least one display insulating layer and on the base layer;
a display element layer on the circuit element layer and comprising a lower electrode and a pixel definition layer having a light emitting opening defined therethrough to expose at least a portion of the lower electrode; and
an organic layer on the display element layer and overlapping the display area and the non-display area, wherein at least one of the display insulating layer or the pixel definition layer comprises an engraved pattern defined therein and comprising an extension portion extending in an extension direction along one side of the display area and protruding portions protruding from the extension portion to a cross direction away from the display area and spaced apart from each other, and the organic layer covers at least a portion of the engraved pattern.

26. The display device of claim 25, wherein the extension portion comprises pattern portions and connection portions alternately arranged with the pattern portions in the extension direction, each of the pattern portions extends from a protruding portion adjacent thereto among the protruding portions, a combined shape of a pattern portion and a protruding portion, which correspond to each other, has a polygonal shape or a circular shape, and each of the connection portions has an area equal to or smaller than 30% of an area of the combined shape of the pattern portion and the protruding portion, which correspond to each other.

27. The display device of claim 25, wherein a maximum width in the extension direction of each of the protruding portions is equal to or smaller than 100 micrometers.

28. The display device of claim 25, further comprising a first inorganic layer between the display element layer and the organic layer and a second inorganic layer on the organic layer, wherein the first inorganic layer and the second inorganic layer are in contact with each other in the non-display area.

29. The display device of claim 28, further comprising at least one sensing insulating layer on the second inorganic layer and a sensing pattern layer on the sensing insulating layer and having a pattern opening defined therethrough to overlap the light emitting opening, wherein the organic layer further comprises an additional organic layer on the sensing insulating layer and covering the sensing pattern layer, and the additional organic layer has a refractive index different from a refractive index of the sensing pattern layer.

30. The display device of claim 29, wherein the engraved pattern comprises a first engraved pattern group in which at least a portion thereof is covered by the organic layer and a second engraved pattern group in which at least a portion thereof is covered by the additional organic layer.

* * * * *